United States Patent
Xiao et al.

(10) Patent No.: US 12,426,250 B2
(45) Date of Patent: Sep. 23, 2025

(54) SEMICONDUCTOR STRUCTURE, METHOD FOR MANUFACTURING SAME AND MEMORY

(71) Applicant: CHANGXIN MEMORY TECHNOLOGIES, INC., Hefei (CN)

(72) Inventors: Deyuan Xiao, Hefei (CN); Guangsu Shao, Hefei (CN); Yunsong Qiu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 521 days.

(21) Appl. No.: 17/948,872

(22) Filed: Sep. 20, 2022

(65) Prior Publication Data
US 2023/0014868 A1    Jan. 19, 2023

Related U.S. Application Data

(63) Continuation of application No. PCT/CN2022/102614, filed on Jun. 30, 2022.

(30) Foreign Application Priority Data

Jun. 21, 2022   (CN) .......................... 202210709242.2

(51) Int. Cl.
H10B 12/00   (2023.01)
(52) U.S. Cl.
CPC ........... H10B 12/33 (2023.02); H10B 12/036 (2023.02); H10B 12/05 (2023.02)
(58) Field of Classification Search
CPC ....... H10B 12/33; H10B 12/036; H10B 12/05
See application file for complete search history.

(56) References Cited

U.S. PATENT DOCUMENTS 5,571,730 A    11/1996  Park
6,355,518 B1    3/2002  Wu
(Continued)

FOREIGN PATENT DOCUMENTS

CN    1599070 A    3/2005
CN    1767199 A    5/2006
(Continued)

OTHER PUBLICATIONS

International Search Report in the international application No. PCT/CN2022/102614, mailed on Mar. 15, 2023.

*Primary Examiner* — Marlon T Fletcher
*Assistant Examiner* — Samuel Jonathan Smith
(74) *Attorney, Agent, or Firm* — SYNCODA LLC; Feng Ma

(57) ABSTRACT

A semiconductor structure, a method for manufacturing the same and a memory are provided. The semiconductor structure includes a substrate, multiple semiconductor pillars, memory structures, and multiple transistors. The multiple semiconductor pillars are arrayed along a first direction and a second direction. Each semiconductor pillar includes a first portion and a second portion on the first portion. The memory structure includes a first electrode layer, a dielectric layer and a second electrode layer. The first electrode layers cover sidewalls of the first portions and are located in first filling regions arranged at intervals. Each first filling region surrounds a sidewall of the first portion. The dielectric layers cover at least surfaces of the first electrode layers. The second electrode layers cover surfaces of the dielectric layers. Channel structures of the transistors are located in the second portions, and extend in a same direction as the second portions.

9 Claims, 25 Drawing Sheets

(56) References Cited

U.S. PATENT DOCUMENTS

| | | |
|---|---|---|
| 7,462,901 B2 | 12/2008 | Tews |
| 7,767,518 B2 | 8/2010 | Tews |
| 9,941,293 B1 | 4/2018 | Pang |
| 10,128,257 B2 | 11/2018 | Pang |
| 11,569,241 B2 | 1/2023 | Kawai |
| 2005/0285176 A1 | 12/2005 | Kim |
| 2006/0240614 A1 | 10/2006 | Tews |
| 2008/0035976 A1 | 2/2008 | Kim |
| 2009/0068806 A1 | 3/2009 | Tews |
| 2010/0295110 A1 | 11/2010 | Takaishi |
| 2011/0244302 A1 | 10/2011 | Wasson |
| 2012/0156844 A1 | 6/2012 | Kim |
| 2013/0148260 A1 | 6/2013 | Wasson |
| 2013/0234240 A1 | 9/2013 | Moon et al. |
| 2014/0035018 A1 | 2/2014 | Lee |
| 2015/0001617 A1 | 1/2015 | Kim et al. |
| 2015/0348976 A1 | 12/2015 | Moon et al. |
| 2018/0102375 A1 | 4/2018 | Pang et al. |
| 2018/0190667 A1 | 7/2018 | Pang et al. |
| 2018/0308923 A1 | 10/2018 | Wu et al. |
| 2019/0103407 A1 | 4/2019 | Kim et al. |
| 2019/0189617 A1 | 6/2019 | Kim et al. |
| 2019/0206982 A1 | 7/2019 | Wu et al. |
| 2019/0252387 A1 | 8/2019 | Moon et al. |
| 2019/0273081 A1 | 9/2019 | Moon et al. |
| 2020/0111793 A1 | 4/2020 | Kim et al. |
| 2020/0243532 A1 | 7/2020 | Kim et al. |
| 2021/0057416 A1 | 2/2021 | Kim et al. |
| 2021/0066306 A1 | 3/2021 | Tang et al. |
| 2021/0151440 A1 | 5/2021 | Tang et al. |
| 2021/0202485 A1 | 7/2021 | Inaba |
| 2021/0202490 A1 | 7/2021 | Cho et al. |
| 2022/0052151 A1 | 2/2022 | Wang |
| 2022/0068925 A1 | 3/2022 | Kawai et al. |
| 2022/0173109 A1 | 6/2022 | Rigano |
| 2022/0246621 A1 | 8/2022 | Cho et al. |

FOREIGN PATENT DOCUMENTS

| | | | |
|---|---|---|---|
| CN | 1868063 A | | 11/2006 |
| CN | 101874303 A | | 10/2010 |
| CN | 103311249 A | | 9/2013 |
| CN | 108735744 A | | 11/2018 |
| CN | 109065501 A | | 12/2018 |
| CN | 109616474 A | | 4/2019 |
| CN | 113078116 A | | 7/2021 |
| CN | 113611671 A | | 11/2021 |
| CN | 113707614 A | | 11/2021 |
| CN | 114068414 A | | 2/2022 |
| CN | 114078777 A | | 2/2022 |
| CN | 114093821 A | | 2/2022 |
| CN | 114256240 A | | 3/2022 |
| CN | 114342065 A | | 4/2022 |
| CN | 114373764 A | | 4/2022 |
| CN | 114551450 A | | 5/2022 |
| CN | 114582808 A | | 6/2022 |
| JP | 861280653 A | | 12/1986 |
| JP | H0864777 A | | 3/1996 |
| JP | 2013168270 A | * | 8/2013 |
| JP | 2013168570 A | | 8/2013 |

\* cited by examiner

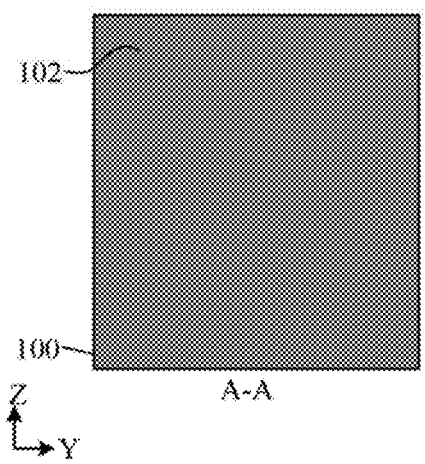
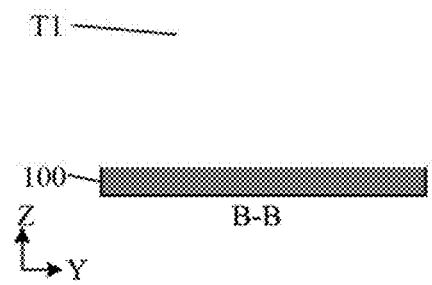
FIG. 4A  FIG. 4B
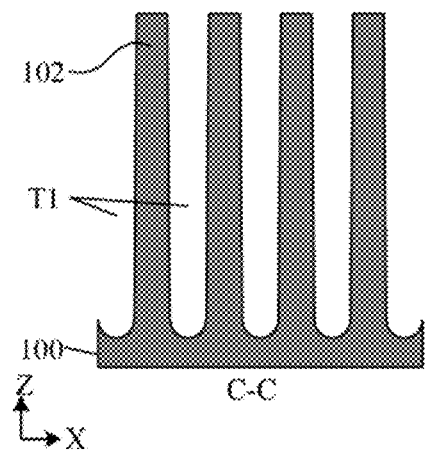
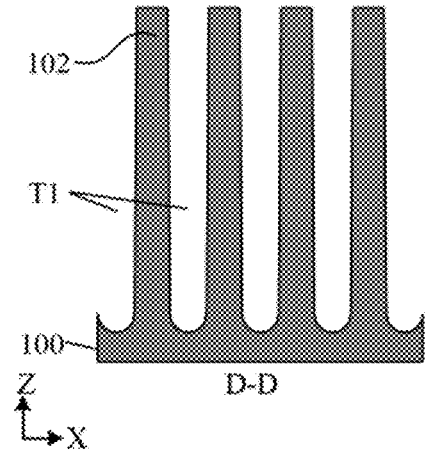
FIG. 4C  FIG. 4D
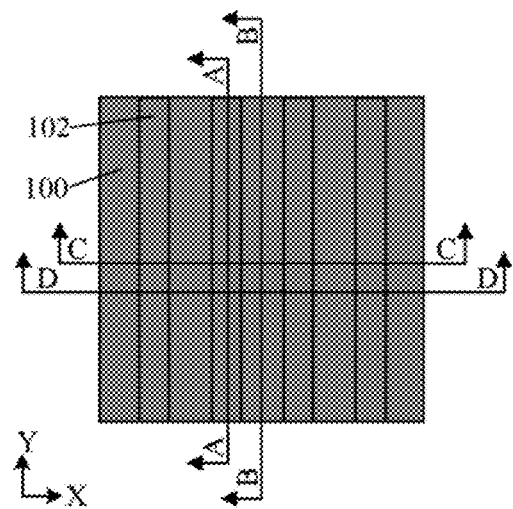
FIG. 4E

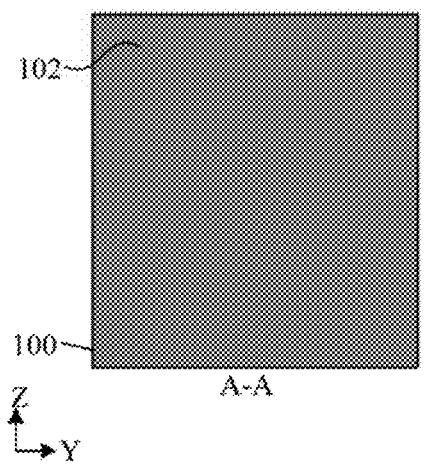
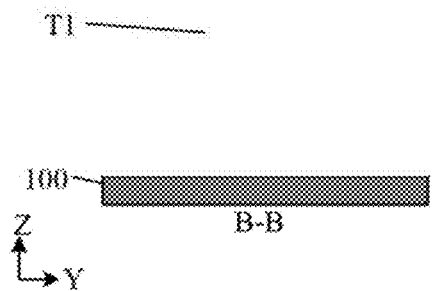
FIG. 5A            FIG. 5B
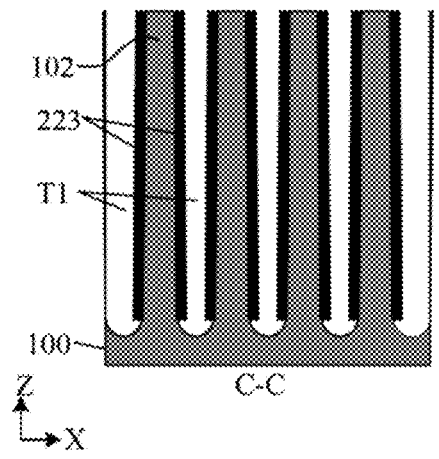
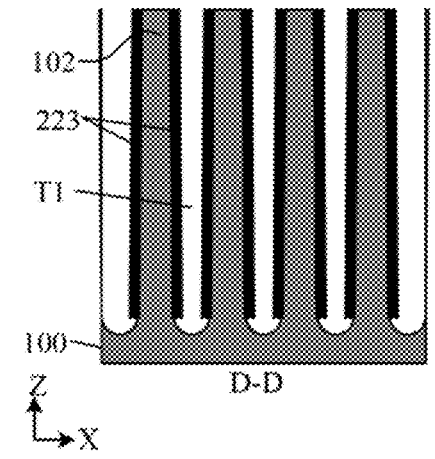
FIG. 5C            FIG. 5D
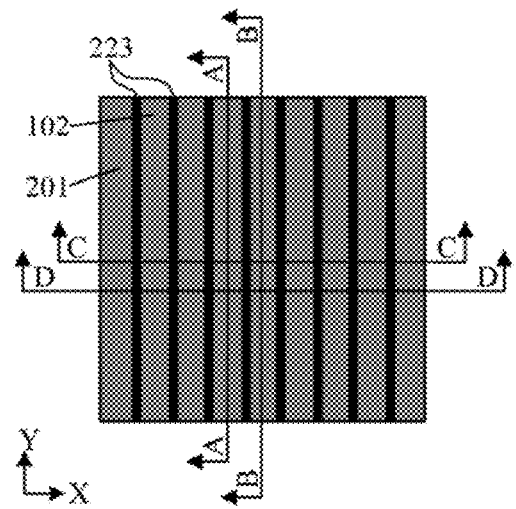
FIG. 5E

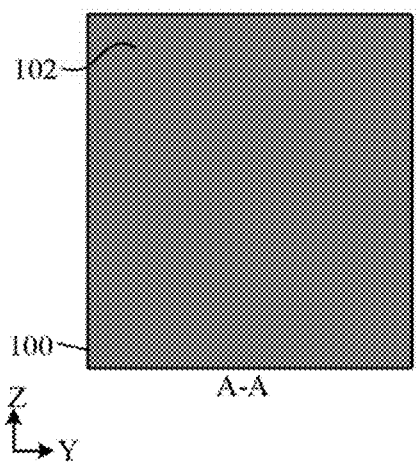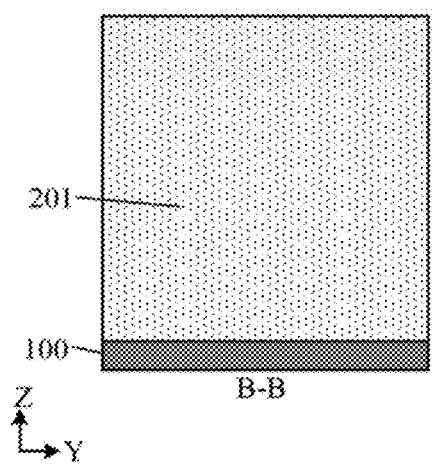
FIG. 6A FIG. 6B
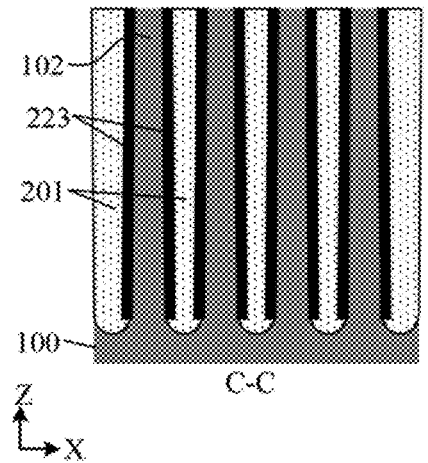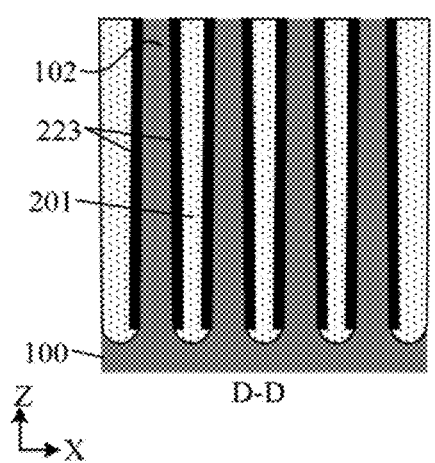
FIG. 6C FIG. 6D
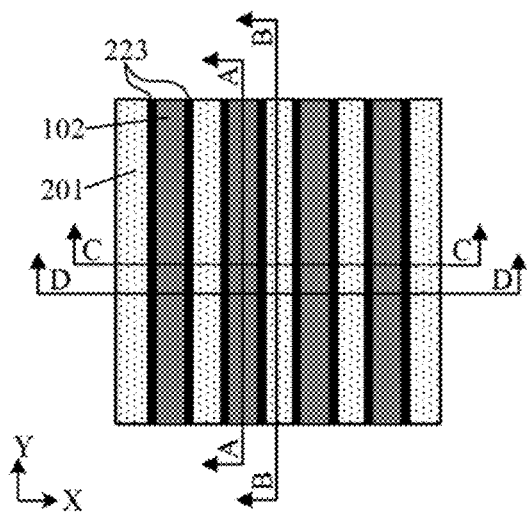
FIG. 6E

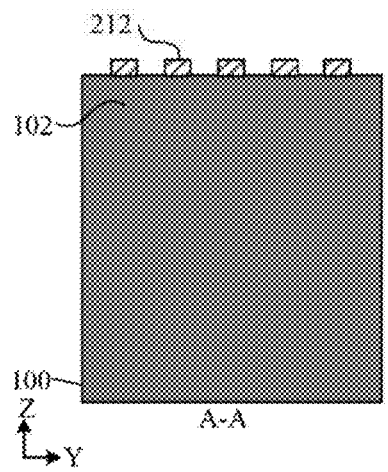 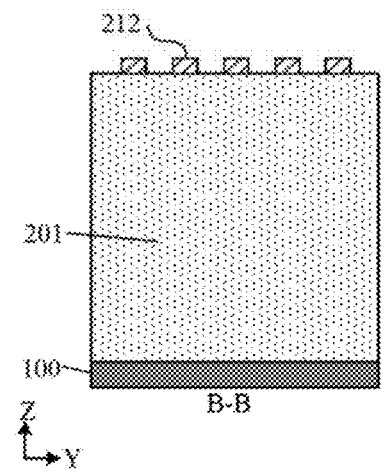
FIG. 7A    FIG. 7B
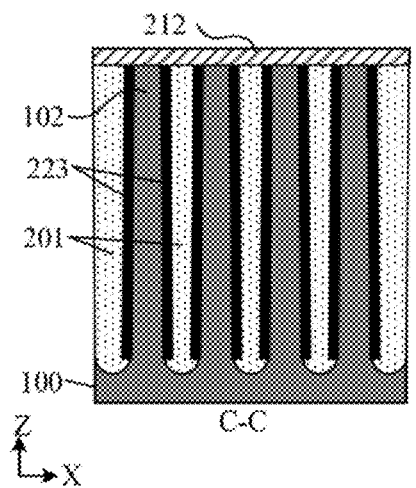 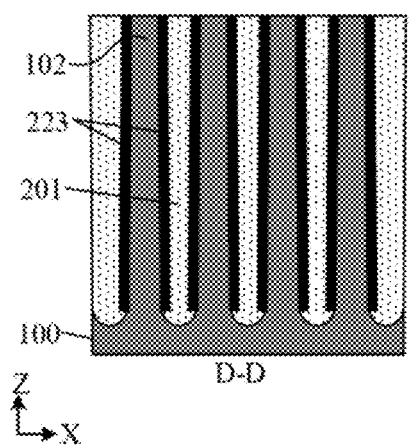
FIG. 7C    FIG. 7D
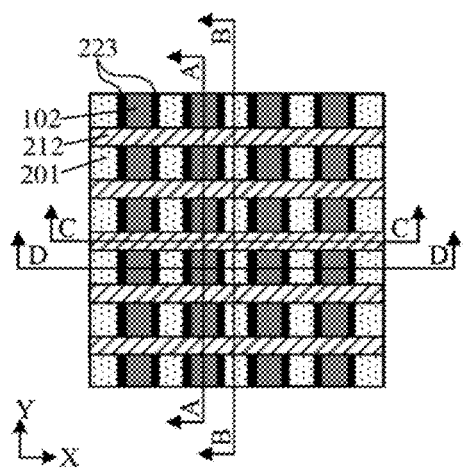
FIG. 7E

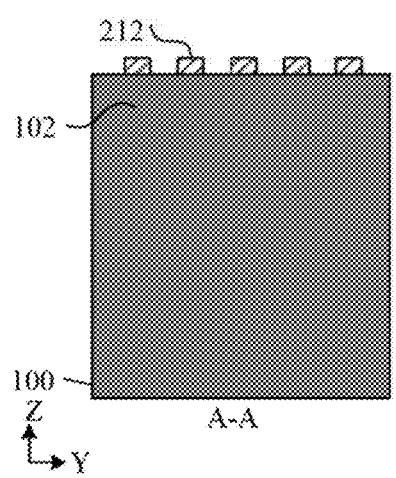
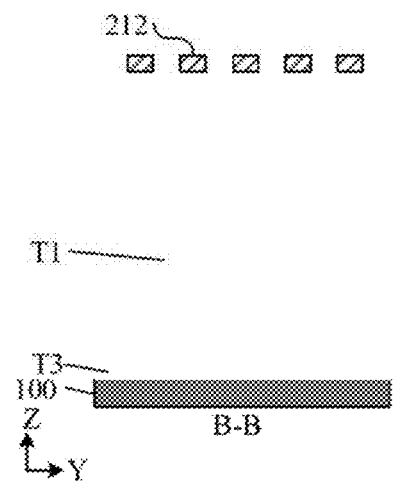
FIG. 9A    FIG. 9B
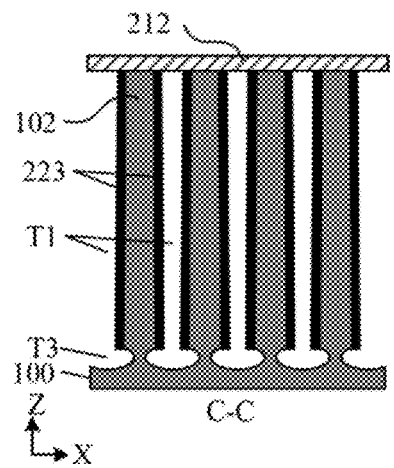
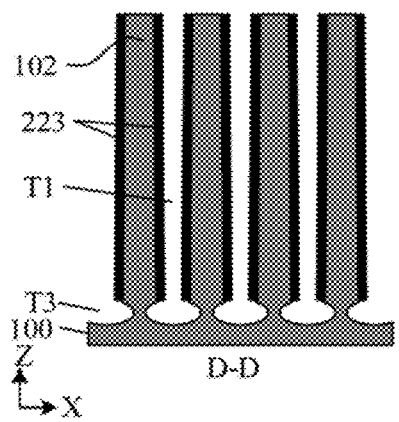
FIG. 9C    FIG. 9D
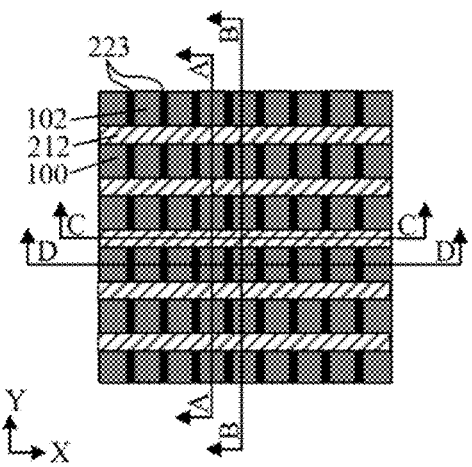
FIG. 9E

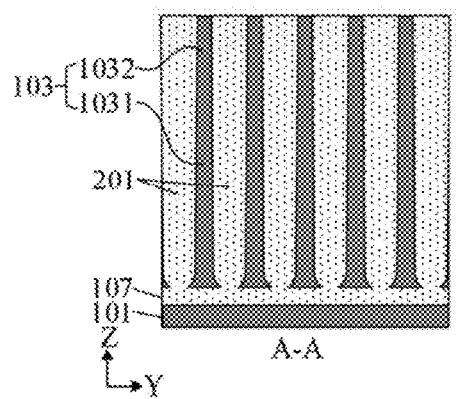 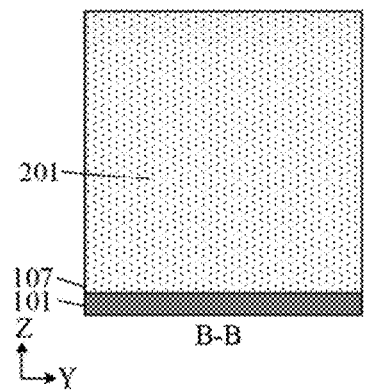
FIG. 14A　　　　　　　　　FIG. 14B
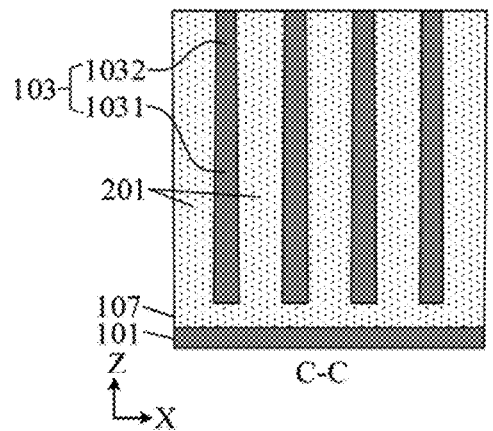 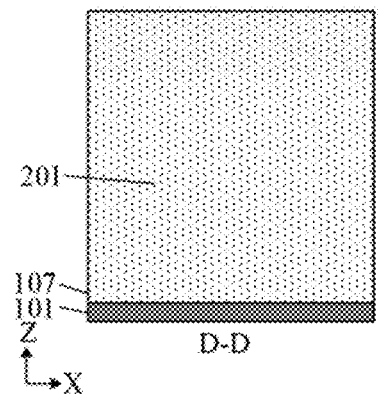
FIG. 14C　　　　　　　　　FIG. 14D
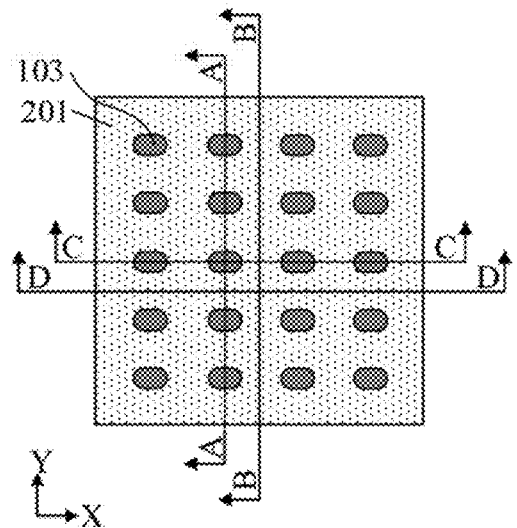
FIG. 14E

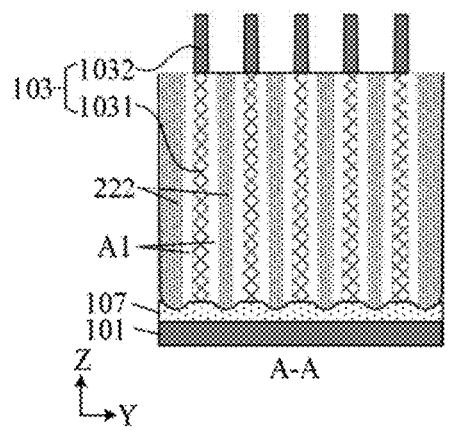 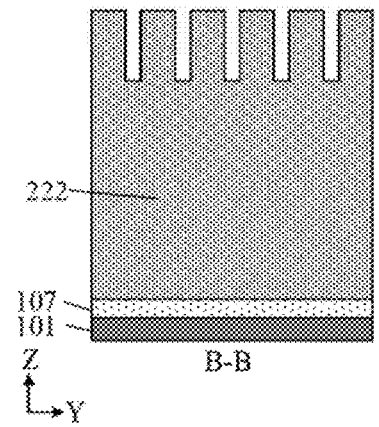
FIG. 21A          FIG. 21B
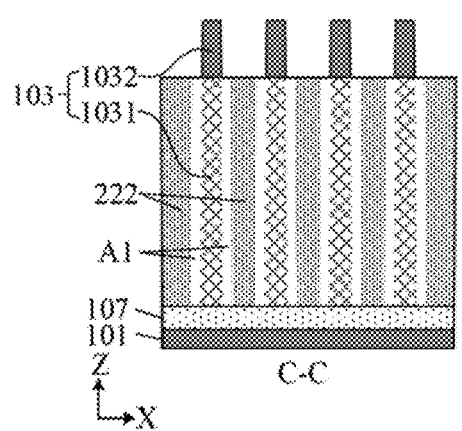 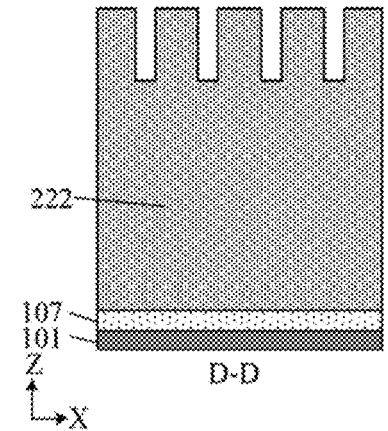
FIG. 21C          FIG. 21D
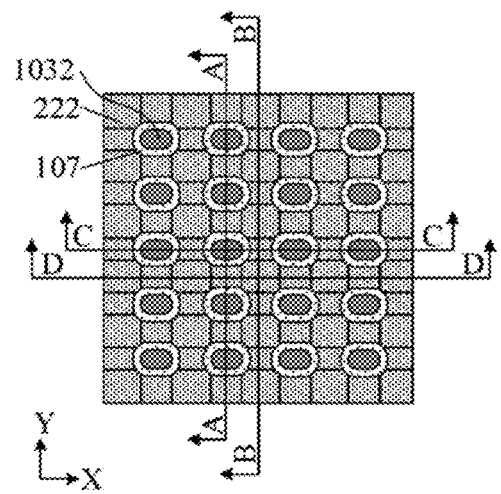
FIG. 21E

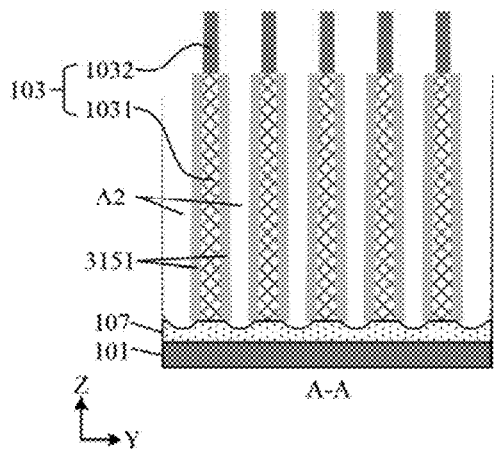 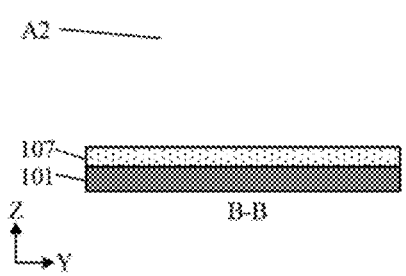
FIG. 23A　　　　　　　FIG. 23B
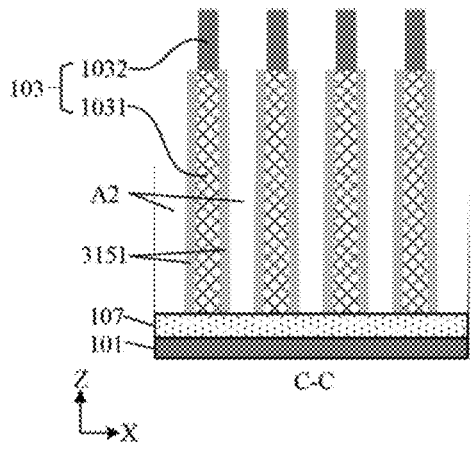 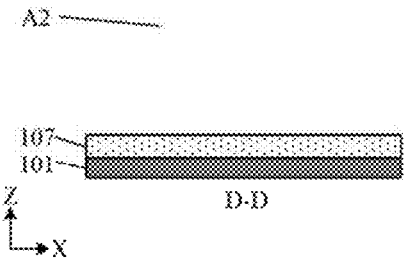
FIG. 23C　　　　　　　FIG. 23D
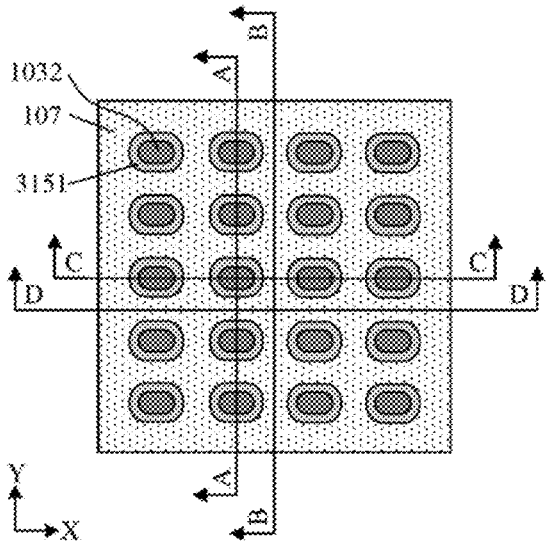
FIG. 23E

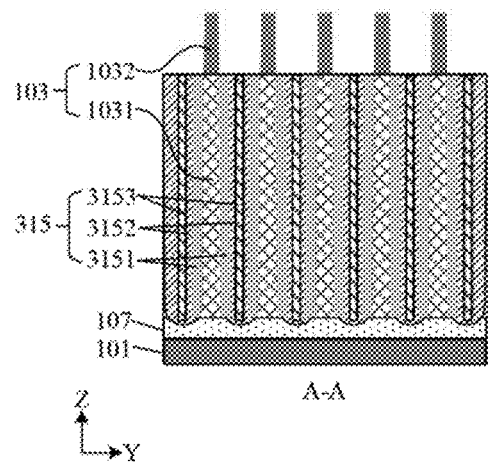
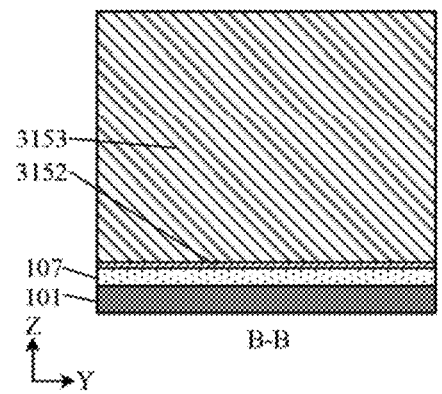
FIG. 24A    FIG. 24B
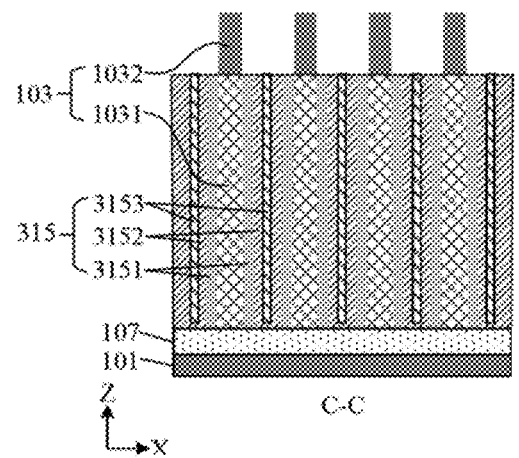
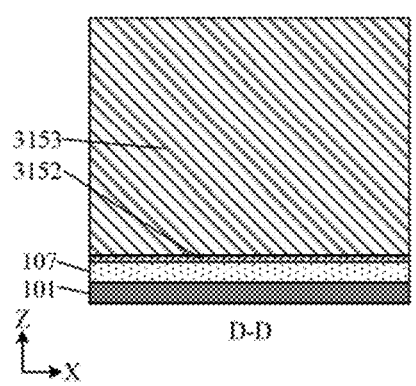
FIG. 24C    FIG. 24D
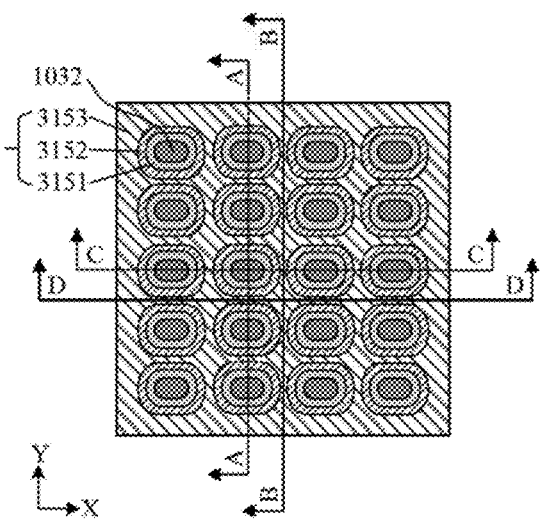
FIG. 24E

SEMICONDUCTOR STRUCTURE, METHOD FOR MANUFACTURING SAME AND MEMORY

CROSS-REFERENCE TO RELATED APPLICATIONS

The present application is a continuation of International Application No. PCT/CN2022/102614, filed on Jun. 30, 2022, which claims priority to Chinese Patent Application No. 202210709242.2, filed on Jun. 21, 2022. The International Application and the Chinese Patent Application are incorporated herein by reference in their entireties.

BACKGROUND

A memory array architecture of a dynamic random access memory (DRAM) is an array composed of memory cells, each of which includes one transistor and one capacitor (that is, a 1T1C memory cell). The gate of the transistor is connected to a word line, the drain is connected to a bit line, and the source is connected to a capacitor.

As a dimension of the DRAM keeps decreasing, so do dimensions of capacitors. How to guarantee the performance of the capacitors of DRAM has become an urgent problem to be solved.

SUMMARY

In view of the above, embodiments of the disclosure provide a semiconductor structure, a method for manufacturing the same and a memory.

According to a first aspect of the present disclosure, a semiconductor structure is provided. The semiconductor structure includes a substrate, a plurality of semiconductor pillars on the substrate, memory structures, and a plurality of transistors.

The plurality of semiconductor pillars are arrayed along a first direction and a second direction. Each of the semiconductor pillars includes a first portion and a second portion on the first portion. The first direction and the second direction intersect and are both parallel to a top surface of the substrate.

Each of the memory structures includes a first electrode layer, a dielectric layer and a second electrode layer. The first electrode layers cover sidewalls of the first portions. The first electrode layers are located in first filling regions arranged at intervals. Each of the first filling regions surrounds a sidewall of each of the first portions. The dielectric layers cover at least surfaces of the first electrode layers. The second electrode layers cover surfaces of the dielectric layers.

Channel structures of the transistors are located in the second portions, and the channel structures extend in a same direction as the second portions.

According to another aspect of the present disclosure, a memory is provided. The memory includes one or more semiconductor structures according to any one of the above embodiments.

According to yet another aspect of the present disclosure, a method for manufacturing a semiconductor structure is provided, which includes the following operations.

A substrate is provided. A plurality of semiconductor pillars arrayed along a first direction and a second direction are formed on the substrate. Each of the semiconductor pillars includes a first portion and a second portion on the first portion. The first direction and the second direction intersect and are both parallel to a top surface of the substrate.

A first supporting layer covering sidewalls and top surfaces of the second portions is formed.

A first sacrificial layer covering a sidewall of each of the first portions is formed.

A second sacrificial layer is filled at least in gaps between the first sacrificial layers.

The first supporting layer is removed to expose the sidewalls and the top surfaces of the second portions.

The first sacrificial layers are removed, to form first filling regions surrounding the first portions and expose the sidewalls of the first portions.

A first electrode layer is formed in each of the first filling regions.

The second sacrificial layer is removed to form second filling regions surrounding the first electrode layers.

Dielectric layers and second electrode layers are formed sequentially in the second filling regions.

A plurality of transistors are formed. Channel structures of the transistors are located in the second portions, and the channel structures extend in a same direction as the second portions.

BRIEF DESCRIPTION OF DRAWINGS

FIG. 3 to FIG. 24E are cross-sectional and top-view schematic diagrams of a semiconductor structure during its manufacturing process provided by an embodiment of the disclosure.

Figure 1:
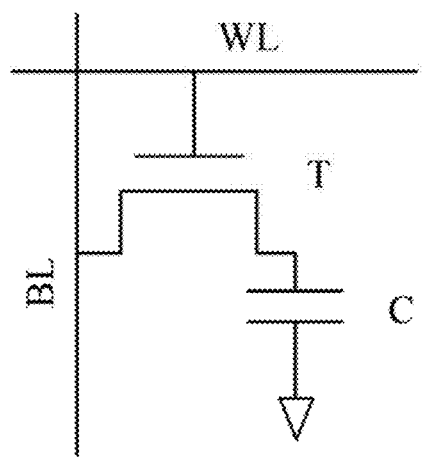
FIG. 1 is a schematic diagram of circuit connection of a DRAM transistor provided by the embodiments of the present disclosure.

In the above drawings (which are not necessarily drawn to scale), similar reference numerals may describe similar components in different views. Similar reference numerals with different letter suffixes may represent different examples of similar components. The accompanying drawings generally illustrate the various embodiments discussed herein by way of example and not limitation.

DETAILED DESCRIPTION

In order to make the technical solution and advantages of the embodiments of the present disclosure clearer, the technical solution of the disclosure will be further explained in detail below with reference to the accompany drawings and embodiments. Although exemplary embodiments of the disclosure are shown in the drawings, it is to be understood that the disclosure may be embodied in various forms and should not be limited by the embodiments set forth herein. On the contrary, these embodiments are provided to enable a more thorough understanding of the disclosure and to fully convey the scope of the disclosure to those skilled in the art.

The disclosure will be described in more detail by way of example in the following paragraphs with reference to the accompany drawings. The advantages and features of the disclosure will become more apparent from the following description and the claims. It is to be noted that the drawings are provided in a very simplified form with inaccurate proportions to illustrate the purposes of the embodiments of the disclosure in a convenient and clear way.

It is understood that the meanings of "on . . . ", "over . . . " and "above . . . " of the disclosure should be interpreted in the broadest scope, so that "on . . . " not only means "on" something without intervening features or layers (that is, directly on something), but also means "on" something with intervening features or layers.

In addition, for ease of description, spatial relative terms such as "on . . . ", "over . . . ", "above . . . ", "up", "upper portion" and the like may be used herein to describe a relationship of one element or feature to another element or feature as shown in the drawings. In addition to the orientations depicted in accompany drawings, the spatial relative terms are intended to encompass different orientations of a device in use or operation. The device may be oriented in other ways (rotating 90 degrees or in other orientations) and similarly the spatial relative descriptors used herein may be interpreted accordingly.

In the embodiments of the disclosure, a term "substrate" refers to a material on which a subsequent layer of material is added. The substrate itself may be patterned. The material added on a top of the substrate may be patterned or may remain unpatterned. In addition, the substrate may include a variety of semiconductor materials, such as silicon, silicon germanium, germanium, gallium arsenide, indium phosphide, and the like. Alternatively, the substrate may be made of a non-conductive material, such as glass, plastic or sapphire wafer.

In the embodiments of this disclosure, the term "layer" refers to a portion of an object that includes a region having a thickness. The layer may extend over an entirety of a lower or upper structure, or may have a range smaller than a range of the lower or upper structure. Further, the layer may be a region of a homogeneous or heterogeneous continuous structure whose thickness is less than a thickness of a continuous structure. For example, the layer may be located between a top surface and a bottom surface of the continuous structure, or the layer may be located between any pair of horizontal surfaces at the top and bottom surfaces of the continuous structure. The layer may extend horizontally, vertically, and/or along an inclined surface. The layer may include multiple sublayers. For example, an interconnect layer may include one or more conductors and contact sublayers in which interconnect lines and/or via contacts are formed, and one or more dielectric sublayers.

In the embodiments of the disclosure, the terms "first", "second" and the like are used to distinguish similar objects and they are not necessarily used to describe a particular order or sequence.

The semiconductor structure according to the embodiments of the disclosure will be used in subsequent processes to form at least a part of a final device structure. The final device may include a memory, including but not limited to a dynamic random access memory, which will be described below only as an example.

However it should be noted that the following description of a DRAM by the embodiments is intended only to illustrate the present disclosure and is not intended to limit the scope of the present disclosure.

With the development of DRAM technology, a dimension of memory cells becomes smaller and smaller, and its array architecture is changed from $8F^2$ to $6F^2$ and then to $4F^2$. In addition, based on requirements in relation to ions and leakage current in the DRAM, a memory architecture changes from a planar array transistor to a recess gate array transistor, and then from the recess gate array transistor to a buried channel array transistor, and then from the buried channel array transistor to the vertical channel array transistor.

In some embodiments of the present disclosure, whether planar transistors or buried transistors are provided, each DRAM is composed of multiple memory cell structures, and each of the memory cell structures is mainly composed of one transistor and one memory cell (memory capacitor) controlled by the transistor, that is, an architecture of the DRAM includes one transistor (T, Transistor) and one capacitor (C, Capacitor) (1T1C). A main action principle of 1T1C is to use an amount of charges stored in the capacitor to represent whether a binary bit is 1 or 0.

FIG. 1 is a schematic diagram of a control circuit using a 1T1C architecture provided by the embodiments of the present disclosure. As shown in FIG. 1, the drain of a transistor T is electrically connected with a bit line (BL), the source of the transistor T is electrically connected with one of the electrode plates of a capacitor C, the other electrode plate of the capacitor C may be connected with a reference voltage, which can be a ground voltage or another voltage, and the gate of the transistor T is connected with a word line (WL). A voltage is applied through a word line WL to control the transistor T to be turned on or off, and a bit line BL is used to perform a read or write operation on the transistor T when the transistor T is turned on.

However, in order to realize the development of miniaturization of a memory, a dimension of the dynamic random access memory keeps decreasing, so do dimensions of capacitors, which makes it more and more difficult to align the capacitors with the transistors. Meanwhile, there is a problem of mutual interference between multiple lower electrode plates in use of the capacitors.

Figure 2:
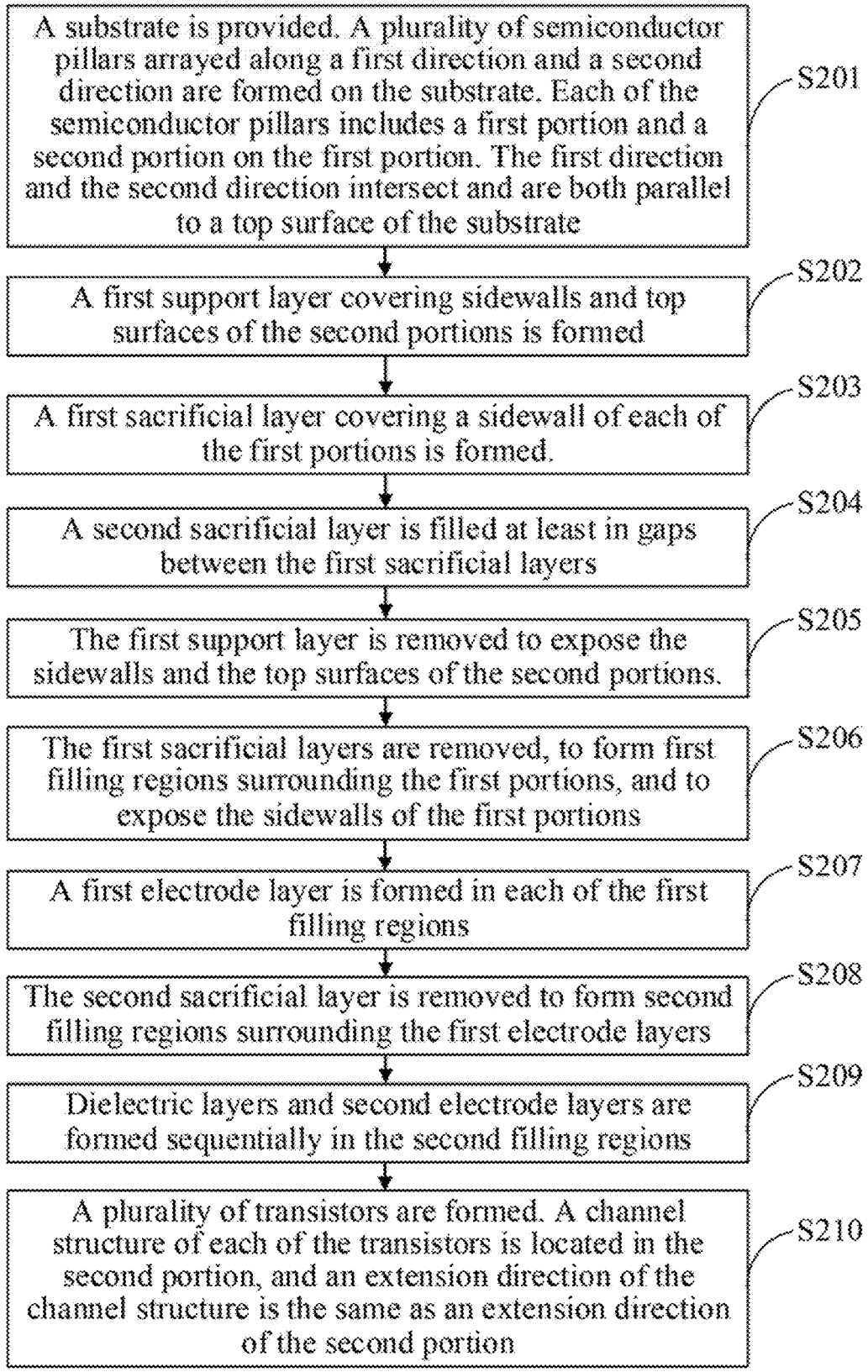
FIG. 2 is a flowchart of a method for manufacturing a semiconductor structure provided by an embodiment of the disclosure.

Based on this, in order to solve one or more of the above problems, the embodiments of the present disclosure provide a method for manufacturing a semiconductor structure. FIG. 2 is a flow diagram of a method for manufacturing a semiconductor structure provided by an embodiment of the disclosure. As shown in FIG. 2, a method for manufacturing a semiconductor structure provided by an embodiment of the disclosure includes the following operations.

In S201, a substrate is provided. Multiple semiconductor pillars arrayed along a first direction and a second direction are formed on the substrate. Each of the semiconductor pillars includes a first portion and a second portion on the first portion. The first direction and the second direction intersect and are both parallel to a top surface of the substrate.

In S202, a first supporting layer covering sidewalls and top surfaces of the second portions is formed.

In S203, a first sacrificial layer covering a sidewall of each of the first portions is formed.

In S204, a second sacrificial layer is filled at least in gaps between the first sacrificial layers.

In S205, the first supporting layer is removed to expose the sidewalls and the top surfaces of the second portions.

In S206, the first sacrificial layers are removed, to form first filling regions surrounding the first portions, and expose the sidewalls of the first portions.

In S207, a first electrode layer is formed in each of the first filling regions.

In S208, the second sacrificial layer is removed to form second filling regions surrounding the first electrode layers.

In S209, dielectric layers and second electrode layers are formed sequentially in the second filling regions.

In S210, multiple transistors are formed, a channel structure of each of the transistors is located in the second portion, and an extension direction of the channel structure is the same as the extension direction of the second portion.

It is to be understood that the operations shown in FIG. 2 are not exclusive and that other operations may be performed before, after, or between any of the operations shown in FIG. 2. The sequence of the operations shown in FIG. 2 can be adjusted according to actual needs.

Here and below, the first direction and the second direction refer to two orthogonal directions parallel to the top surface of the substrate. The third direction is a direction perpendicular to the top surface of the substrate, that is, the third direction is an extension direction of the semiconductor pillars. The top surface of the substrate may be understood as a plane perpendicular to the extension direction of the semiconductor pillars.

In some embodiments, an included angle between the first direction and the second direction ranges from 0 to 90 degrees. In some specific embodiments, the first direction may be perpendicular to the second direction. It is to be understood that, the angle between the first direction and the second direction defines a positional relationship of the semiconductor pillars arrayed along the first direction and the second direction.

For example, the first direction is represented as the X direction in the accompany drawings. The second direction is represented as the Y direction in the accompany drawings. The third direction is represented as the Z direction in the accompany drawings.

FIG. 3 to FIG. 24E are cross-sectional and top-view schematic diagrams of a semiconductor structure during its manufacturing process provided by an embodiment of the disclosure. The method for manufacturing the semiconductor structure provided by the embodiment of the disclosure will be described in detail with reference to FIG. 2 and FIG. 3 to FIG. 24E.

In order to clearly describe the present disclosure, the following embodiment is described with the first direction being perpendicular to the second direction as an example. Illustratively, take FIG. 24A to FIG. 24E as examples, the first direction is the X-axis direction shown in FIG. 24E. The second direction is the Y-axis direction shown in FIG. 24E. The third direction is the Z-axis direction shown in FIG. 24A to FIG. 24D. However, it should be noted that the following description of the directions by the embodiments is intended only to illustrate the present disclosure and is not intended to limit the scope of the present disclosure.

It is to be noted that figures numbered with a same number in FIGS. 4A to 24E represent plan schematic diagrams of multiple views in at least one process operation. Take FIGS. 24A to 24E as examples, FIG. 24E is a top-view schematic diagram, and FIGS. 24A to 24D are cross-sectional schematic diagram along cross-sectional directions A-A, B-B, C-C and D-D in FIG. 24E, respectively. So do FIGS. 4A to 23E, which will not be repeated here and below.

Referring to FIG. 3 to FIG. 13E, S201 is performed to form multiple semiconductor pillars.

In some embodiments, the formation of multiple semiconductor pillars arrayed along a first direction and a second direction on the substrate includes the following operations.

A semiconductor substrate is provided.

Multiple first trenches arranged at intervals along the first direction and multiple second trenches arranged at intervals along the second direction are formed in the substrate.

The first trenches divide the semiconductor substrate into multiple semiconductor strips, and the second trenches divide each of the semiconductor strips into multiple semiconductor pillars. A width of each of the semiconductor pillars in the first direction is different from a width of the semiconductor pillar in the second direction.

Figure 3:
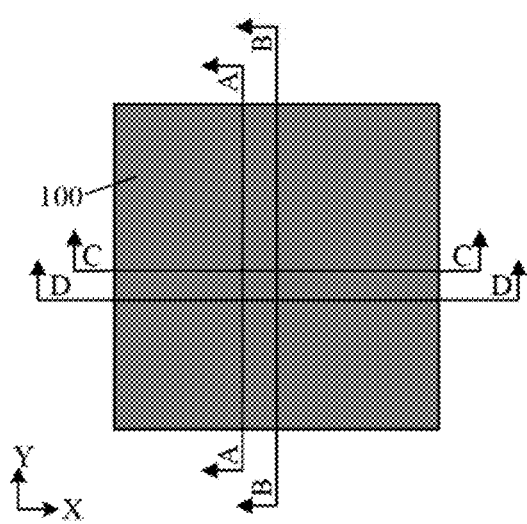
Figure 8E:
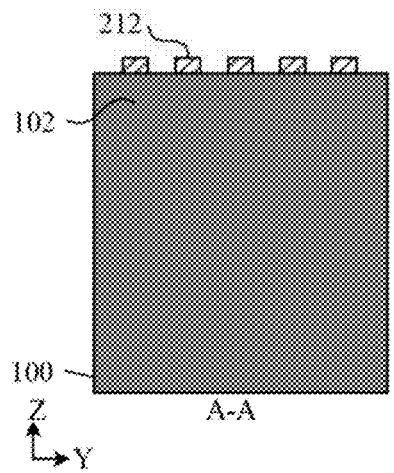
Figure 8E:
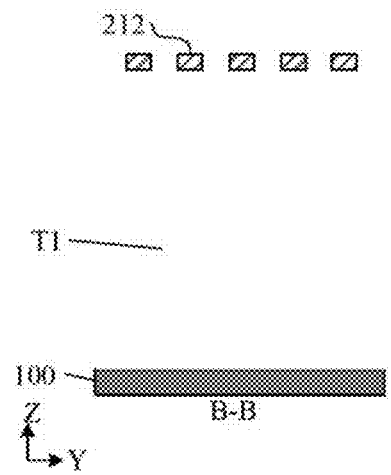
Figure 8E:
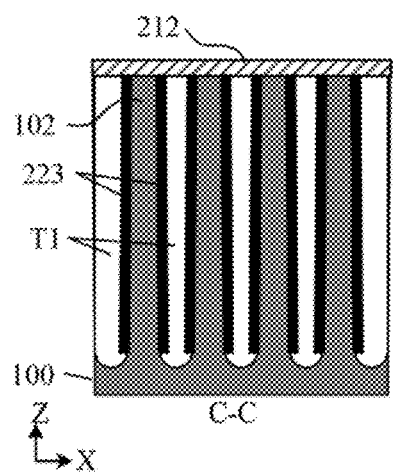
Figure 8E:
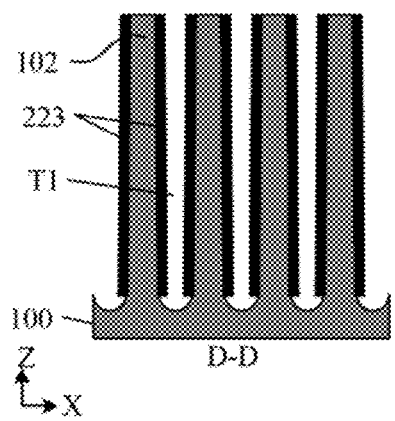
Figure 8E:
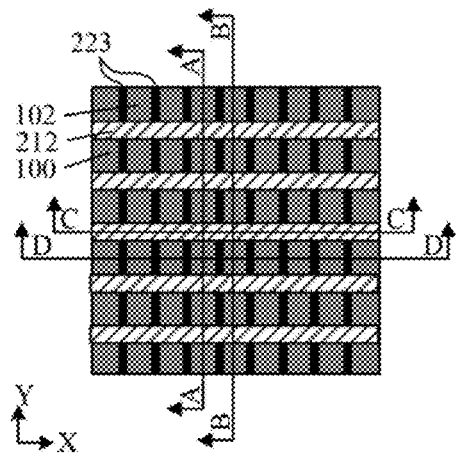
Figure 10A:
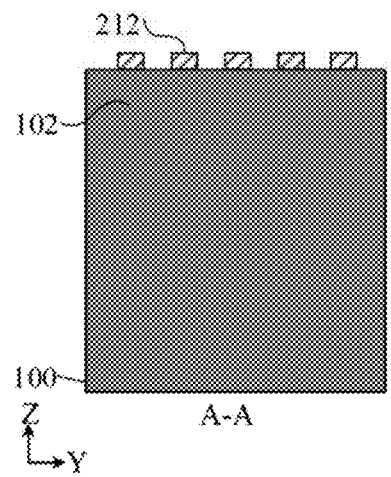
Figure 10B:
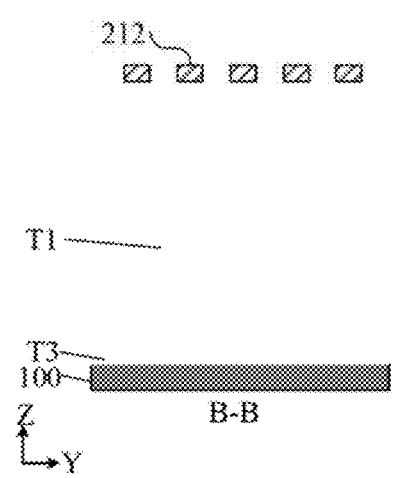
Figure 10C:
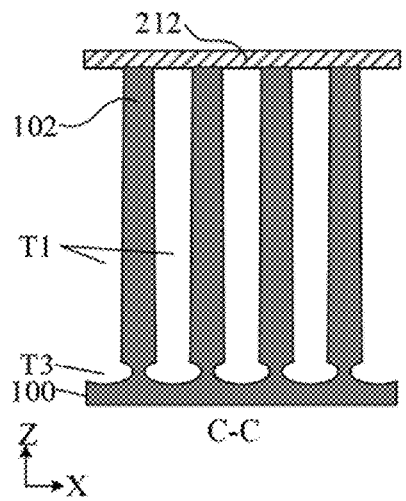
Figure 10D:
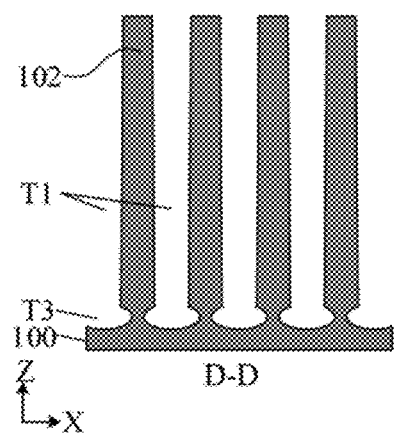
Figure 10E:
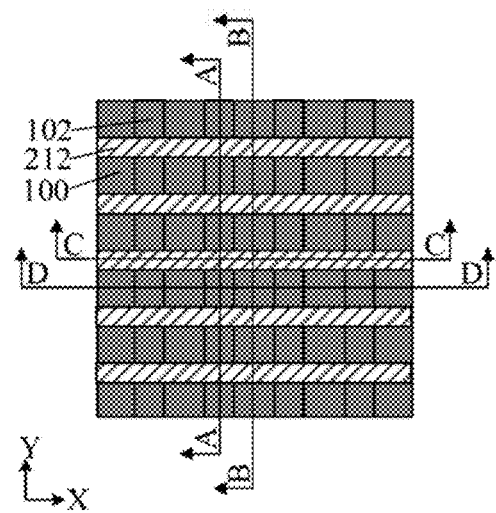
Figure 11A:
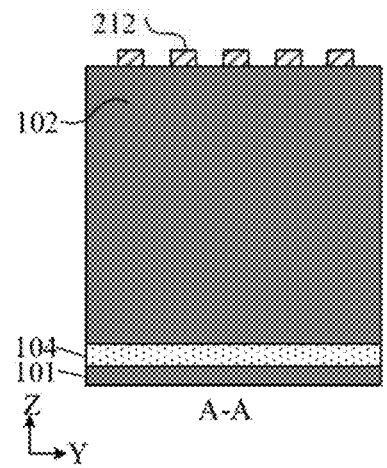
Figure 11B:
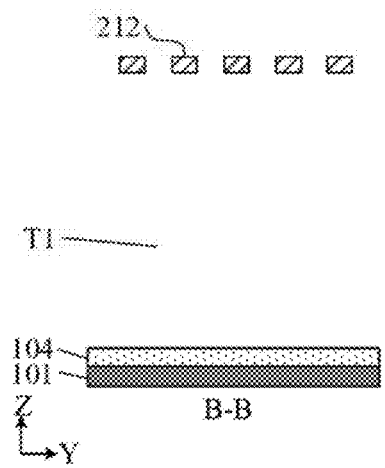
Figure 11C:
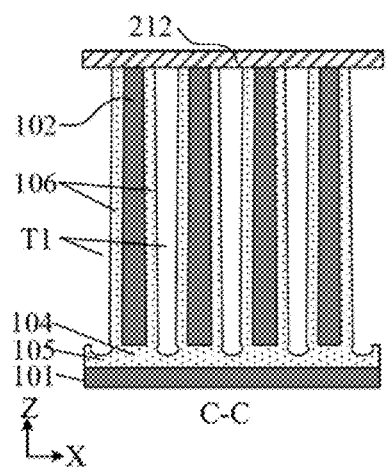
Figure 11D:
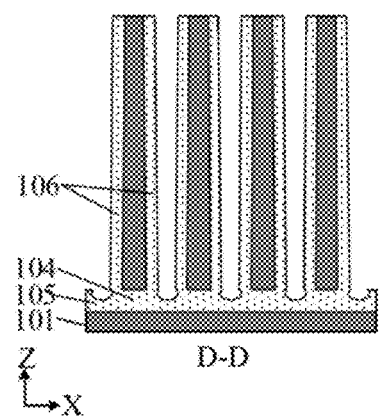
Figure 11E:
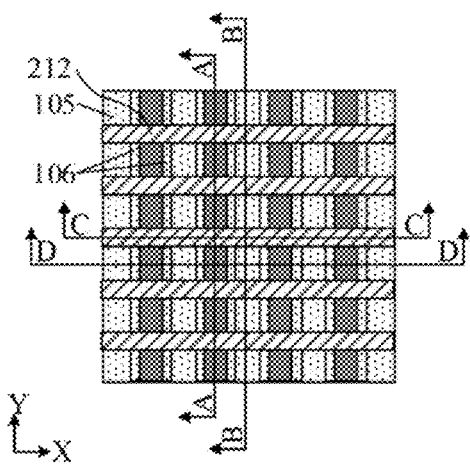
Figure 12A:
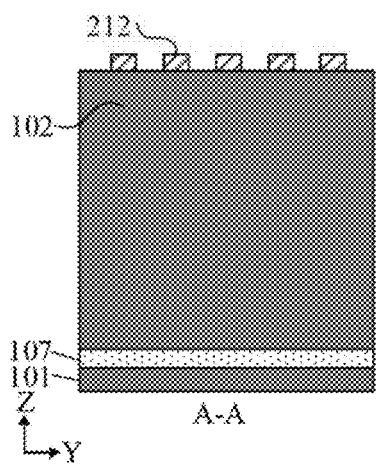
Figure 12B:
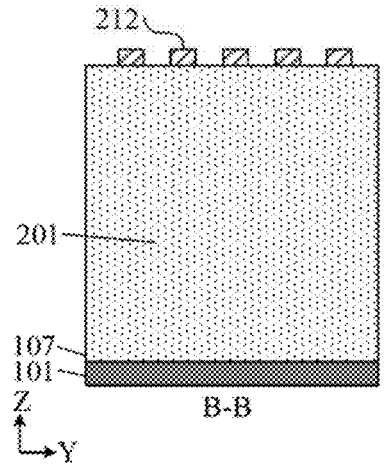
Figure 12C:
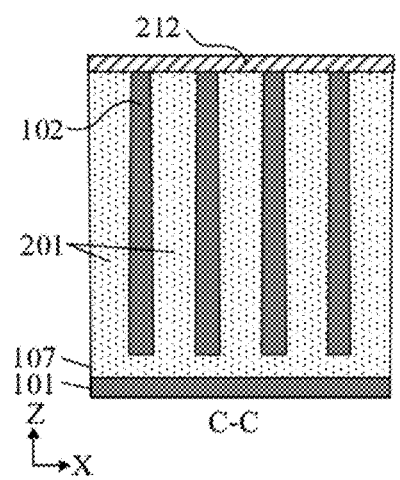
Figure 12D:
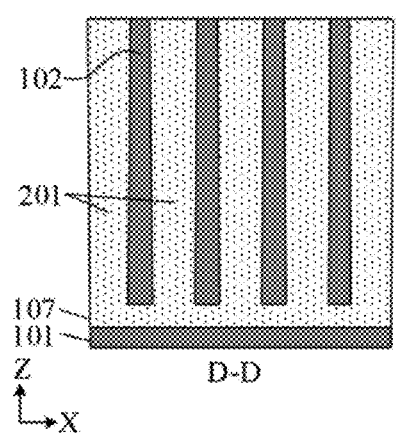
Figure 12E:
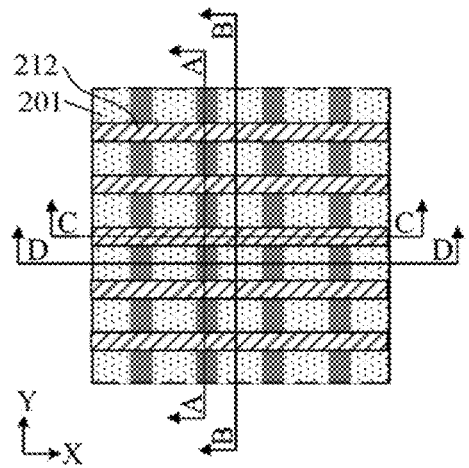
Figure 13A:
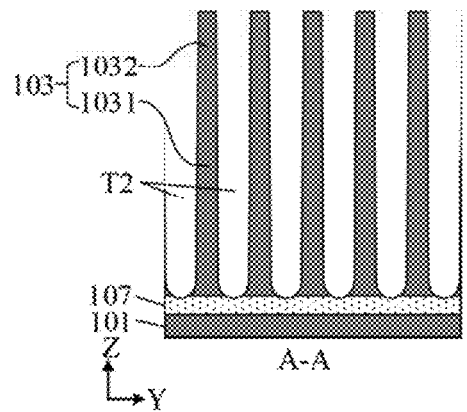
Figure 13B:
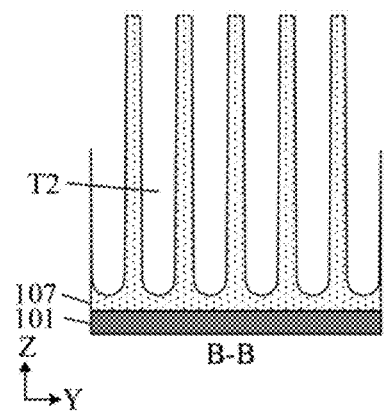
Figure 13C:
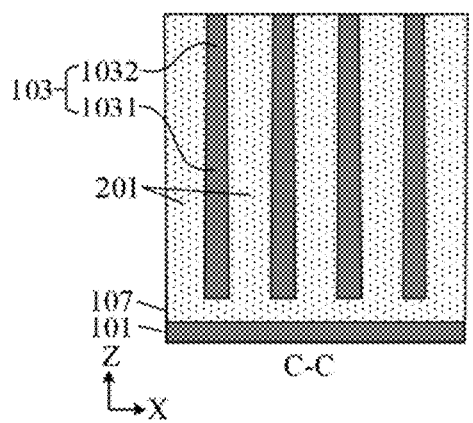
Figure 13D:
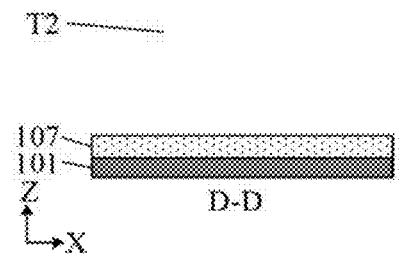
Figure 13E:
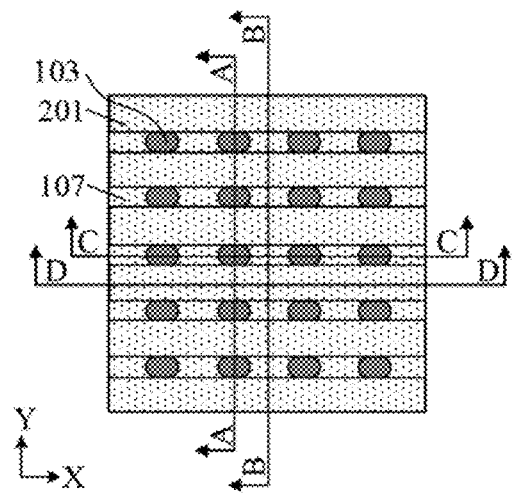
Figure 15E:
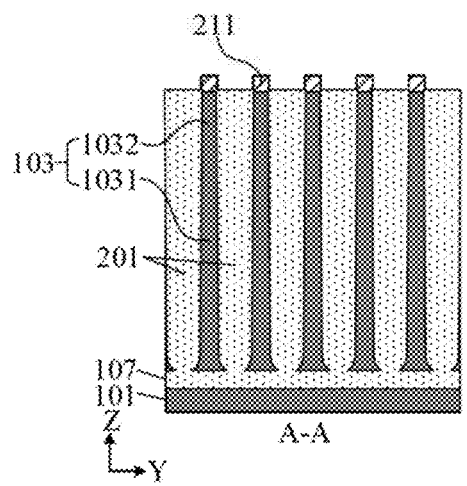
Figure 15E:
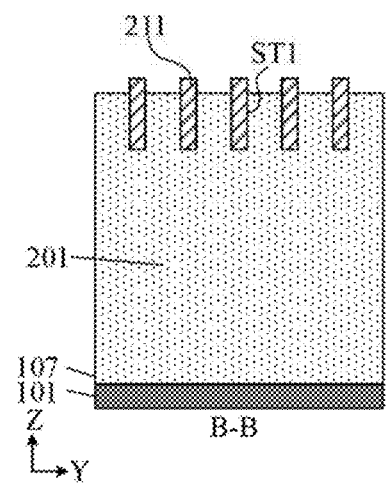
Figure 15E:
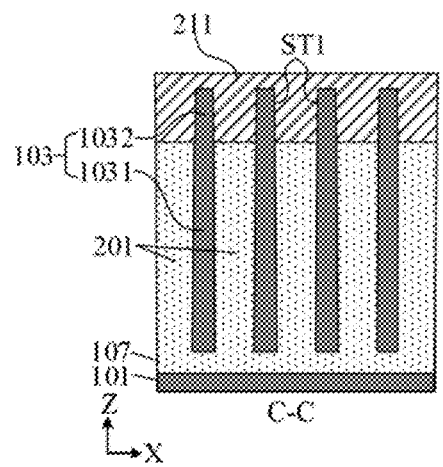
Figure 15E:
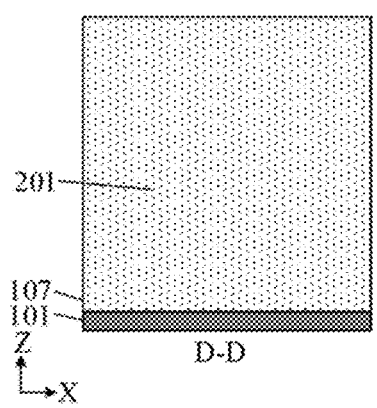
Figure 15E:
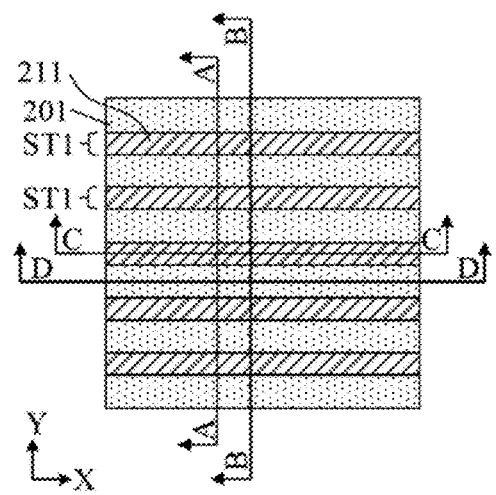
Figure 16A:
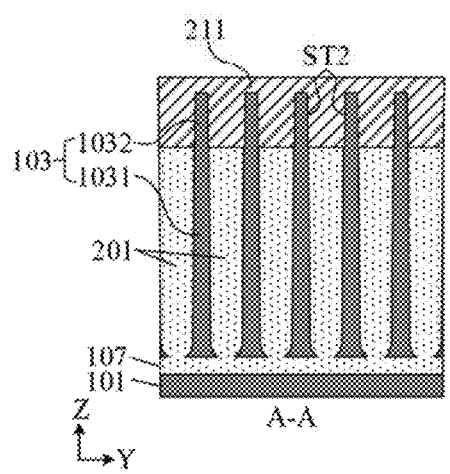
Figure 16B:
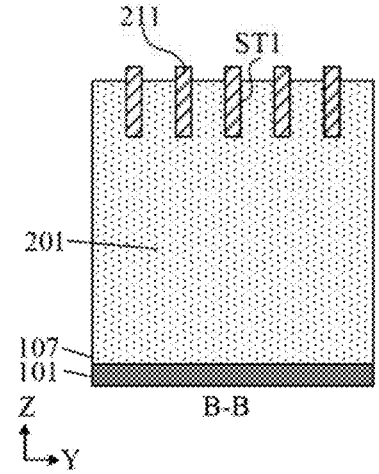
Figure 16C:
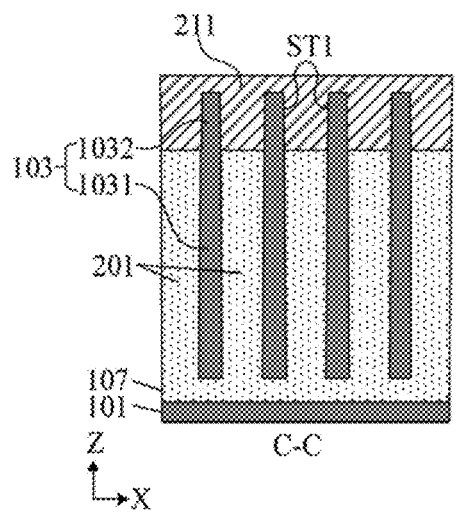
Figure 16D:
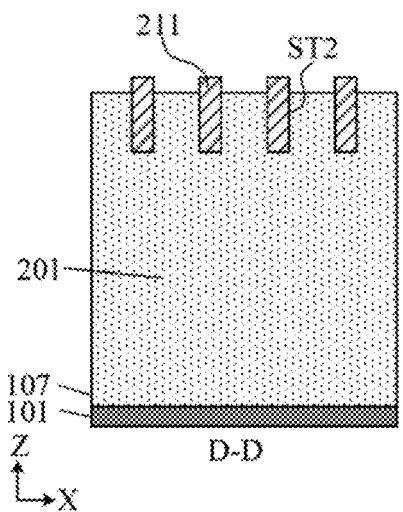
Figure 16E:
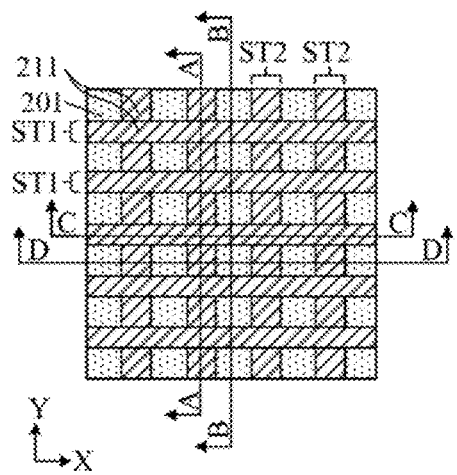
Figure 17A:
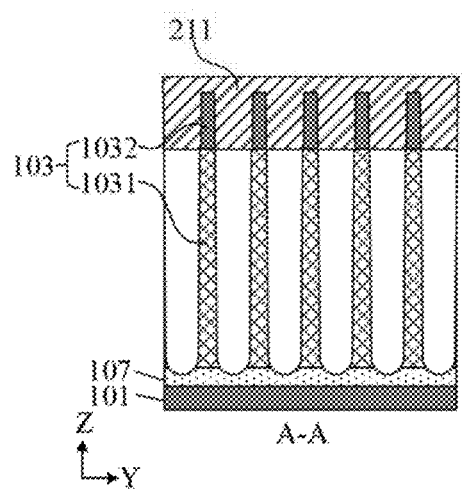
Figure 17B:
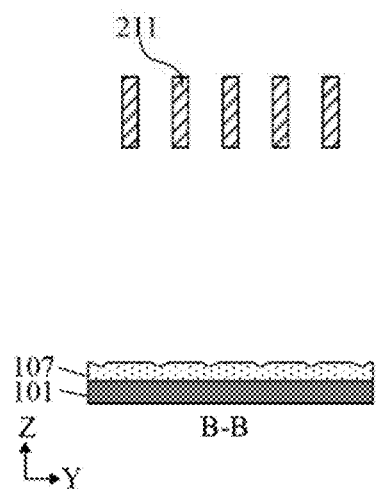
Figure 17C:
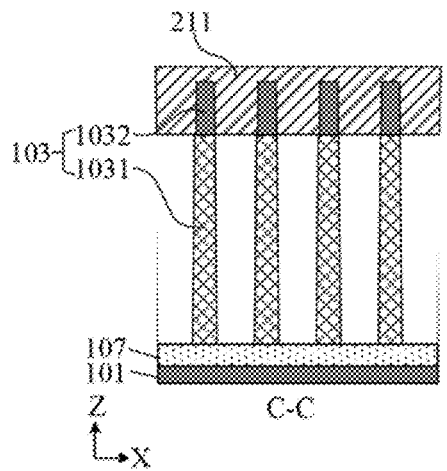
Figure 17D:
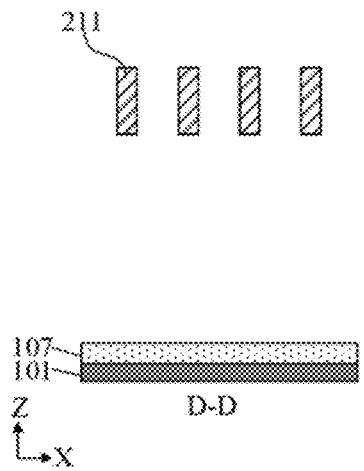
Figure 17E:
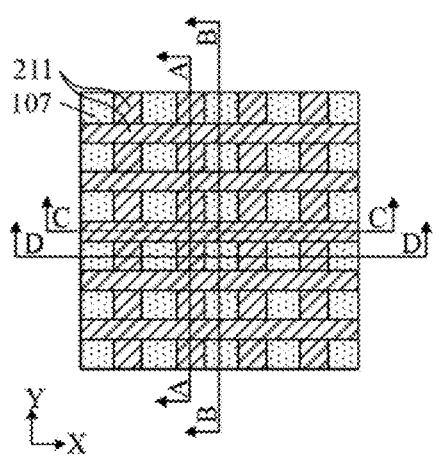
Figure 18A:
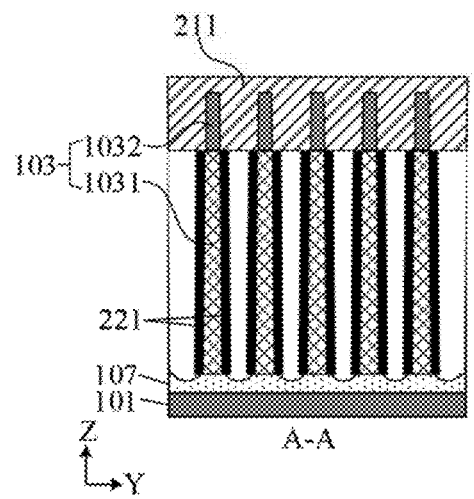
Figure 18B:
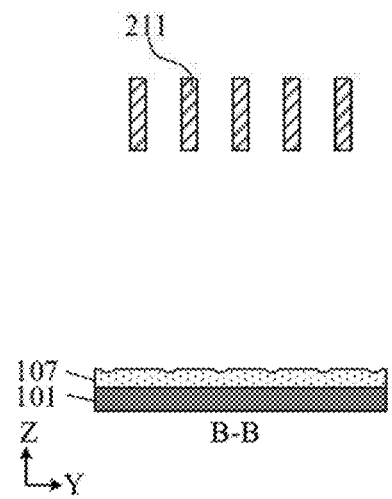
Figure 18C:
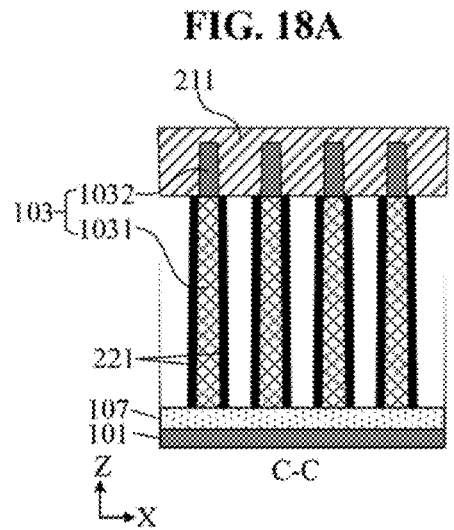
Figure 18D:
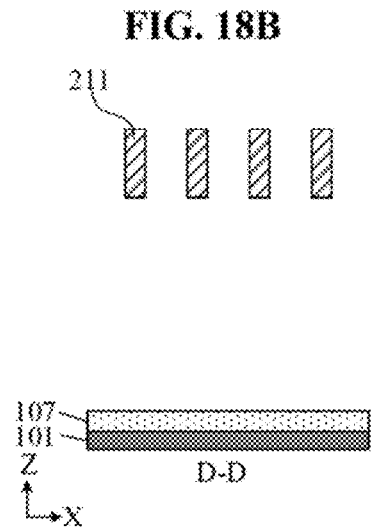
Figure 18E:
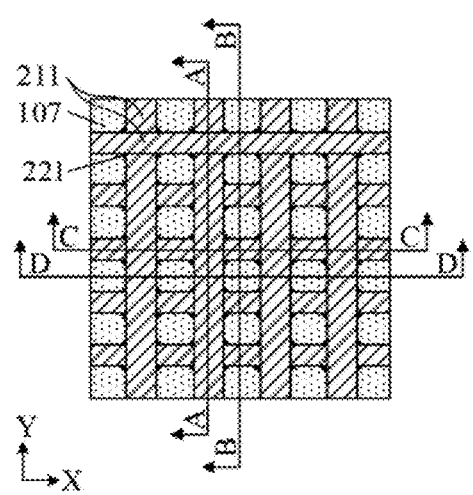
Figure 19A:
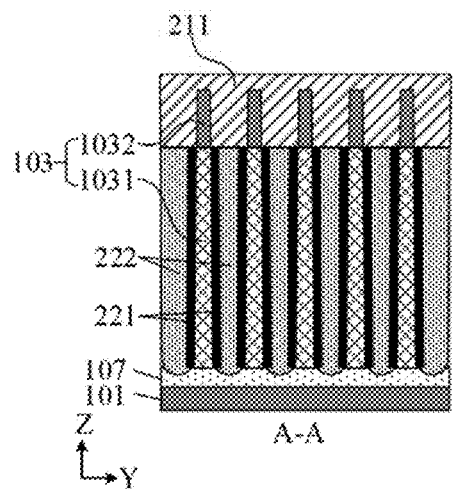
Figure 19B:
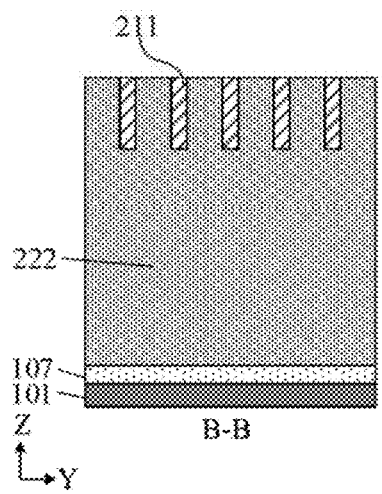
Figure 19C:
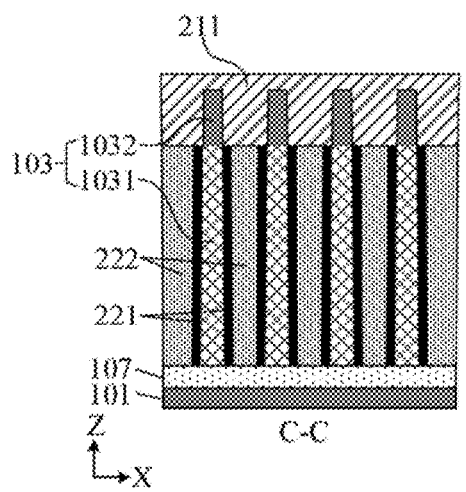
Figure 19D:
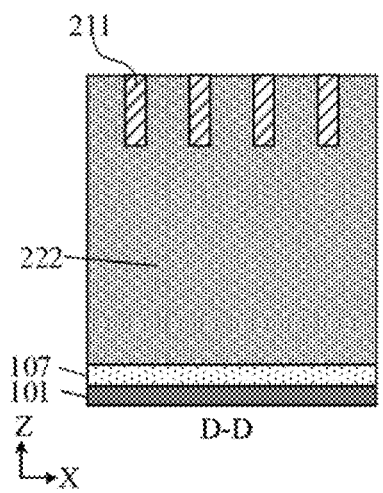
Figure 19E:
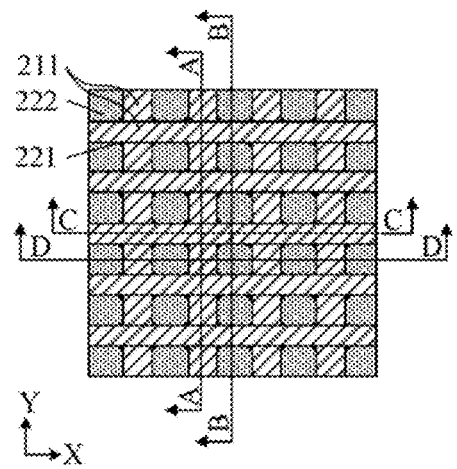
Figure 20A:
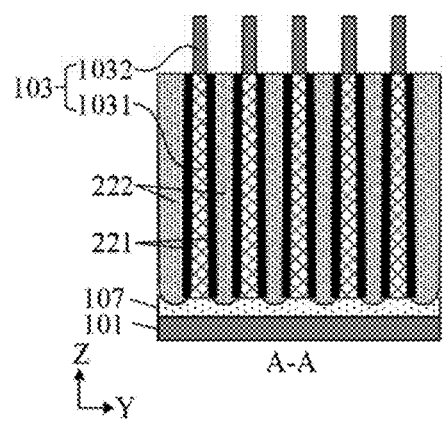
Figure 20B:
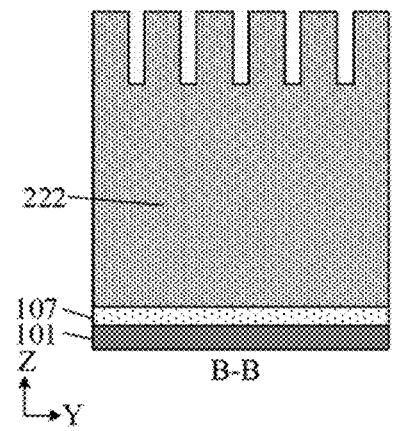
Figure 20C:
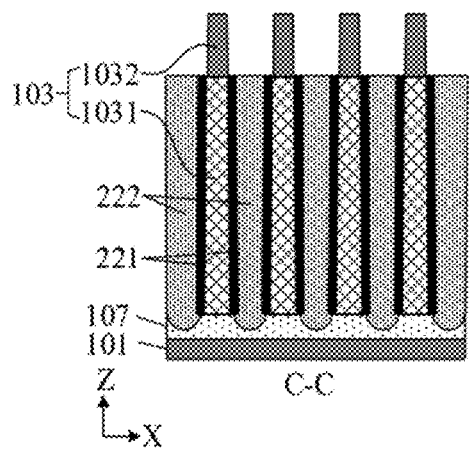
Figure 20D:
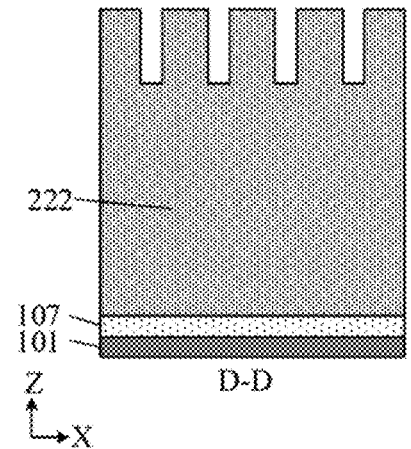
Figure 20E:
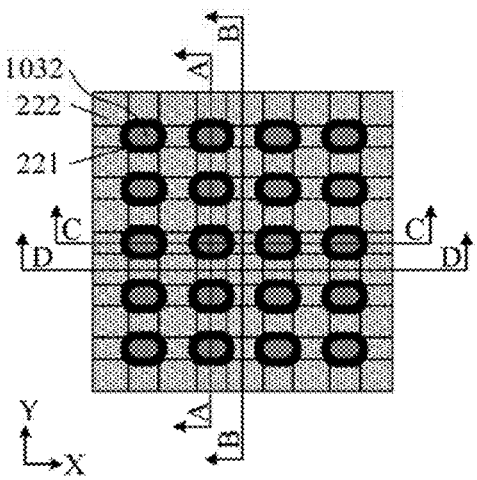
Figure 22A:
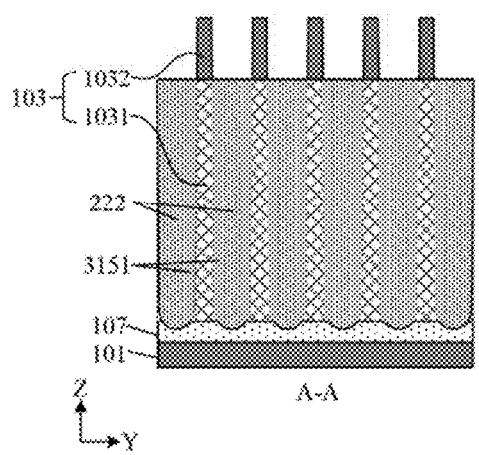
Figure 22B:
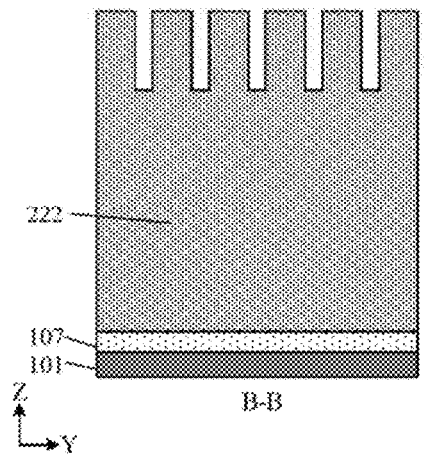
Figure 22C:
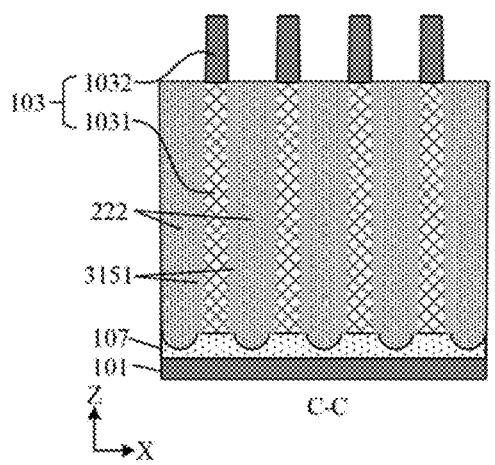
Figure 22D:
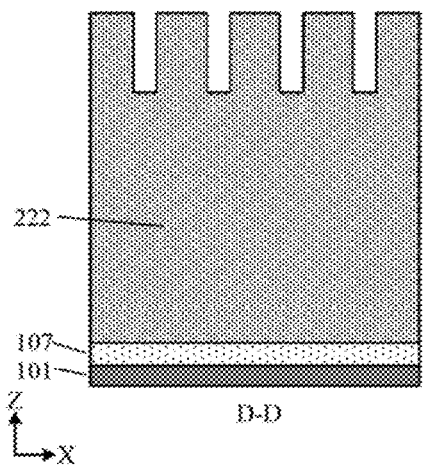
Figure 22E:
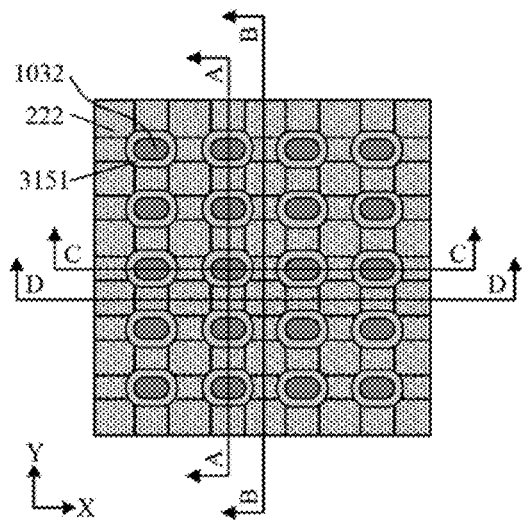

Referring to FIG. 3, a material of the semiconductor substrate 100 may include silicon (Si), germanium (Ge), silicon germanium (SiGe) and the like.

Referring to FIGS. 4A to 4E, a first etching is performed on the top surface of the semiconductor substrate 100 by a Lithography-Etch (LE) process, to form the multiple first trenches T1 arranged at intervals in the first direction in the substrate. Herein, each of the first trenches T1 extends in the second direction. The first trenches T1 divide the semiconductor substrate 100 into the multiple semiconductor strips 102.

Referring to FIGS. 13A to 13E, a second etching is performed on the top surface of the semiconductor substrate 100 by a Lithography-Etch (LE) process, to form the multiple second trenches T2 arranged at intervals in the second direction in the substrate. Each of the second trenches T2 extends in the first direction. The second trenches T2 divide each of the semiconductor strips 102 into the multiple semiconductor pillars 103. It is to be noted that, an isolation structure 107 in FIGS. 13A-13E will be explained below with reference to FIGS. 7A-12E.

Herein, the first trenches T1 and the second trenches T2 are located in the semiconductor substrate. That is to say, a depth of the first trenches T1 and the second trenches T2 in the third direction is smaller than a thickness of the semiconductor substrate 100 in the third direction.

In some examples, the first trenches T1 and the second trenches T2 include but are not limited to shallow trench isolation (STI) structures.

The first etching and the second etching include but are not limited to a dry plasma etching process.

In practical application, a width of each of the semiconductor pillars 103 in the first direction is different from a width of the semiconductor pillar in the second direction, which helps to improve stability of the semiconductor structure. For example, considering the stability of the formed semiconductor strips 102, the width of each of the semiconductor pillars 103 in the first direction may be greater than the width of the semiconductor pillar 103 in the second direction. That is to say, when the first trenches T1 are formed, the width of the semiconductor strips 102 may be set to be wider. Therefore, in the case when the first trenches T1 have a high aspect ratio, the semiconductor strips 102 have a lower aspect ratio relative to the first trenches T1, since the width of the semiconductor strips 102 is set to be wider. Therefore, the semiconductor strips 102 have better supportability without collapsing, thereby contributing to improvement in the stability of the semiconductor structure.

In some embodiments, the method further includes the following operations.

Third sacrificial layers are formed at sidewalls of the first trenches prior to forming the second trenches.

A bottom of each of the first trench is enlarged.

The third sacrificial layers are removed.

An oxidation treatment is performed on the semiconductor strips, to completely oxidize a portion of each of the semiconductor strips, which corresponds to the enlarged portion of the first trench, into an oxide strip, and to oxidize surfaces of a remaining portion of the semiconductor strip into oxide layers.

A first insulating material is filled in gaps between the oxide layers and between the oxide strips.

Referring to FIGS. 5A-5E, third sacrificial layers 223 are formed.

A material of the third sacrificial layers 223 may include, but is not limited to, silicon nitride.

In practical application, the third sacrificial material may be deposited on sidewalls and bottoms of the first trenches T1 by a physical vapor deposition (PVD) process, a chemical vapor deposition (CVD) process, an atomic layer deposition (ALD) process and the like. The third sacrificial material at the bottoms of the first trenches T1 may be removed by a plasma etching process or a reactive ion etching process.

Illustratively, a plasma enhanced chemical vapor deposition (PECVD) method is adopted to deposit silicon nitride on the sidewalls and bottoms of the first trenches T1, by a reverse top selective (RTS) process. A plasma etching process is adopted to remove silicon nitride at the bottoms of the first trenches T1 by using hydrofluoric acid, to obtain silicon nitride retained on the sidewalls of the first trenches.

It is to be noted that, by using the RTS process, a thickness of the third sacrificial layers 223 deposited on the sidewall of each of the first trenches becomes thicker as a depth of the first trench T1 increases. As a result, when the first trenches T1 have a high aspect ratio, the thicker third sacrificial layers can be deposited on the sidewalls of the bottoms of the semiconductor strips 102, thereby protecting the bottoms of the semiconductor strips 102 better when the bottoms of the first trenches are subsequently enlarged.

Referring to FIGS. 9A-9E, by using the third sacrificial layers 223 as a mask, the bottom of each of the first trenches T1 is enlarged, to form a third trench T3 having a bowl-shaped space.

Herein, the adopted etching process may include a wet etching process, a dry etching process, and the like.

Illustratively, in a wet etching process, with the third sacrificial layers 223 as a mask, an etchant is introduced into the bottom of each of the first trenches T1. A width in the X-axis direction of the bottom of the first trench T1 is increased by isotropic etching of the etchant. That is to say, a width in the X-axis direction of transition portions from the bottom of the semiconductor strip 102 to the substrate 101 is smaller than the width in the X-axis direction of the semiconductor strip 102. Moreover, it is to be understood that, due to the isotropic etching of the etchant, the third trench T3 having the bowl-shaped space is formed, and the depth, of the bottom of the first trench T1 in the Z-axis direction is increased.

Referring to FIGS. 10A-10E, the third sacrificial layers are removed. As a result, the sidewalls of the semiconductor strips 102 are exposed.

Referring to FIGS. 11A-11E, the semiconductor strips 102 are subjected to an oxidation treatment.

Illustratively, the semiconductor strips 102 are oxidized by the oxidation process, so that the transition portions from the bottoms of the semiconductor strips 102 to the substrate 101 are completely oxidized into oxide strips 104, the surfaces of the second portions of the exposed semiconductor strips are oxidized into oxide layers 106, and the top surface of the substrate 101 is also oxidized into a substrate oxide layer 105.

Herein, materials of the oxide strips 104 and the oxide layers 106 are same. Illustratively, the materials of the oxide strips 104 and the oxide layers 106 include, but are not limited to, silicon oxide.

It is to be noted that, after enlarging the first trenches T1 in the foregoing embodiment, the transition portions from the bottoms of the semiconductor strips 102 to the substrates 101 are smaller in dimension and are easy to be completely oxidized. Meanwhile, the semiconductor strips 102 are relatively larger in dimension, and only the surfaces are oxidized.

After the semiconductor strips 102 are oxidized, the semiconductor strips 102 and the substrate 101 are electrically isolated by the oxide strips 104, such that the defect of electric leakage between the semiconductor strips 102 and the substrate 101 are prevented.

It is to be noted that, when the first trenches T1 are formed in the foregoing embodiment, the width of the semiconductor strips 102 may be set to be wider, so that effective dimension of the semiconductor strips 102 that will not be oxidized will not be very small even after the semiconductor strips 102 are oxidized.

Referring to FIGS. 12A to 12E, a first insulating material is filled in gaps between the oxide layers and between the oxide strips, to form an isolation structure.

Herein, a method for filling the first insulating material 201 includes, but is not limited to PVD, CVD and the like.

A material of the first insulating material 201 is the same as or different from that of the oxide strips 104 and the oxide layers 106. Illustratively, a material of the first insulating material 201 includes, but is not limited to, silicon oxide.

In practical application, the first insulating material 201 may be filled between the multiple oxide strips 104 and between the multiple semiconductor strips 102 on which the oxide layers 106 are formed, so that the first insulating material 201 is substantially flush with top surfaces of the semiconductor strips 102. The first insulating material 201 between the multiple oxide strips 104 together with the oxide strips 104 and the substrate oxide layer 105 constitutes the isolation structure 107 on the substrate 101. Illustratively, a material for forming the isolation structure 107 includes, but is not limited to, silicon oxide. The isolation structure 107 can mitigate the leakage problem between functional devices (e.g. the semiconductor pillars 103 and the storage structures 315 described below with reference to FIGS. 24A-24E) on the isolation structure 107 and the substrate 101.

In some embodiments, the method further includes the following operations.

A first insulating material is filled in the first trenches in which the third sacrificial layers are formed, after forming the third sacrificial layers on the sidewalls of the first trenches.

A plurality of second supporting layers arranged at intervals in the second direction are formed on the semiconductor strips and the first insulating material. The first insulating material filled in the first trenches is removed, and the bottoms of the first trenches are enlarged.

Referring to FIGS. 6A to 6E, the first insulating material 201 is filled in the first trenches T1 in which the third sacrificial layers 223 are formed.

Herein, a method for filling the first insulating material 201 includes, but is not limited to PVD, CVD and the like.

The first insulating material 201 is different from a material of the third sacrificial layers 223. Illustratively, a material for forming the first insulating material 201 includes, but is not limited to, silicon oxide.

Referring to FIGS. 7A-7E, multiple second supporting layers 212 are formed.

Herein, a second supporting material covering the first insulating material 201 and the semiconductor strips 102 is formed by a process, including but not limited to, PVD, CVD or the like. The second supporting material is then etched to form the multiple second supporting layers 212 arranged at intervals in the second direction by a lithography-etch process.

Herein, a material of the second supporting layers 212 is different from the material of the first insulating material 201 and the material of the third sacrificial layers 223. Illustratively, a material for forming the second supporting layers 212 includes, but is not limited to, carbon.

Referring to FIGS. 8A-8E, the second supporting layers 212 are used as a supporting layer, the first insulating material 201 filled, which is described with reference to FIGS. 6A-6E, is removed, and the bottoms of the first trenches are enlarged.

Since the multiple semiconductor strips 102 arranged at intervals along the first direction are supported by the second supporting layers 212, the structure is more stable, which facilitates the enlarging of the bottoms of the first trenches.

It is to be understood that, since part of the bottoms of the semiconductor strips 102 are removed when the bottoms of the first trenches are enlarged, the width of the bottoms of the semiconductor strips 102 in the X-axis direction is smaller than widths of middles and tops of the semiconductor strips 102 in the X-axis direction, and/or the width of the bottoms of the semiconductor strips 102 in the Y-axis direction is smaller than widths of the middles and tops of the semiconductor strips 102 in the Y-axis direction. Therefore, the bottoms of the semiconductor strips 102 cannot provide effective support for the semiconductor strips 102, such that the semiconductor strips 102 are prone to fall and collapse. At this time, with the second supporting layers 212 as the supporting layer, the second supporting layers 212 play a function of supporting the structure and preventing collapse during forming the semiconductor strips 102, the oxide strips 104, and the isolation structure 107 (referring to FIGS. 11A-11E and 12A-12E), thereby facilitating the stability of the formed semiconductor structure.

In some embodiments, the formation of the multiple second trenches includes the following operation.

The semiconductor substrate is etched to form the second trenches by using the second supporting layers as a mask.

Referring to FIGS. 7A-7E above, the multiple second supporting layers 212 arranged at intervals in the second direction are formed by adjusting parameters of the lithography-etch process. The second supporting layers 212 extend in the first direction and cover part of the top surfaces of the semiconductor strips 102. The part of the top surfaces of the semiconductor strips 102 covered by the second supporting layers 212 is used to protect the formation of the semiconductor pillars 103. Referring to FIGS. 13A-13E, the second supporting layers 212 function as the supporting layer while also as a mask for forming the second trenches T2, which is beneficial to the stability of the semiconductor structure, saves the process steps, simplifies the process and reduces the manufacturing cost.

Herein, the adopted etching process may include a wet etching process, a dry etching process, and the like.

Illustratively, in the dry etching process, by using the second supporting layers 212 as a mask, the multiple second trenches T2 arranged at intervals along the second direction are formed by etching, and the second trenches T2 penetrate through the semiconductor strips 102 along the Z-axis direction.

It is to be noted that, after forming the second trenches T2, the method further includes filling the second trenches T2 with the first insulating material 201 (referring to FIGS. 14A-14E).

Herein, a method for filling the first insulating material 201 includes, but is not limited to PVD, CVD and the like.

The first insulating material 201 is the same as or different from a material of the isolation structure 107. Illustratively, a material for forming the first insulating material 201 includes, but is not limited to, silicon oxide.

After the first insulating material 201 is filled in the second trenches T2, the second supporting layers 212 are removed. Top surfaces of the first insulating material 201 and the semiconductor pillars 103 are subjected to chemical mechanical polishing (CMP), so that the top surfaces of the first insulating material 201 and the semiconductor pillar 103 are flush.

S202 is performed to form a first supporting layer.

In some embodiments, the formation of a first supporting layer covering sidewalls and top surfaces of the second portions includes the following operations.

The first insulating material is filled between the multiple semiconductor pillars.

Part of the first insulating material is removed in the first direction to form multiple first shallow trenches. Bottom surfaces of the first shallow trenches are flush with bottom surfaces of the second portions.

A first supporting material is deposited on top surfaces of the semiconductor pillars and in the first shallow trenches.

Part of the first insulating material is removed in the second direction to form multiple second shallow trenches. Bottom surfaces of the second shallow trenches are flush with the bottom surfaces of the second portions.

The first supporting material is filled in the second shallow trenches to form the first supporting layer.

Referring to FIGS. 14A to 14E, the first insulating material 201 is filled between the multiple semiconductor pillars 103.

Herein, a method for filling the first insulating material 201 includes, but is not limited to PVD, CVD and the like.

The first insulating material 201 is the same as or different from a material of the isolation structure 107. Illustratively, the first insulating material 201 is the same as the material of the isolation structure 107. The material for forming the first insulating material 201 includes, but is not limited to, silicon oxide.

Referring to FIGS. 15A to 16E, the first supporting layer is formed.

A third etching is performed on the first insulating material 201 by a lithography-etch process, to form multiple first shallow trenches ST1 arrayed in the first direction and the second direction in the first insulating material 201. Herein, each of the first shallow trenches ST1 is located between two adjacent ones of the second portions 1032 in the first direction. A bottom surface of each of the first shallow trenches ST1 is flush with bottom surfaces of the second portions 1032, exposing opposite sidewalls of the second portions 1032 adjacent in the first direction. The first supporting material is deposited on the top surfaces of the semiconductor pillars 103 and in the first shallow trenches ST1.

A fourth etching is performed on the first insulating material 201 by a lithography-etch process, to form multiple second shallow trenches ST2 arrayed in the first direction and the second direction in the first insulating material 201. Each of the second shallow trenches ST2 is located between two adjacent ones of the second portions 1032 in the second direction. A bottom surface of each of the second shallow trenches ST2 is flush with bottom surfaces of the second portions 1032, exposing opposite sidewalls of the second portions 1032 adjacent in the second direction. The first supporting material is deposited on the top surfaces of the semiconductor pillars 103 and in the second shallow trenches ST2, to form the first supporting layer 211. A method for filling the first supporting material includes, but is not limited to PVD, CVD and the like.

The third etching and the fourth etching include, but are not limited to, a dry plasma etching process.

Herein, the material of the first supporting material is different from the material of the first insulating material 201. Illustratively, a material for forming the first supporting material includes, but is not limited to, carbon.

Referring to FIGS. 17A to 17E, the first insulating material 201 between the multiple semiconductor pillars 103 (referring to FIGS. 16A to 16E) is removed, to expose the sidewalls of the first portions 1031.

Part of the first supporting layer 211 covering the sidewalls of the second portions 1032 is used to protect the sidewalls of the second portions 1032. Part of the first supporting layer 211 covering the top surfaces of the second portions 1032 is used to protect the top surfaces of the second portions 1032. Meanwhile, the part of the first supporting layer 211 covering the top surfaces of the second portions 1032 is a one-piece network structure, which is beneficial to effectively support the semiconductor pillars 103. That is to say, the first supporting layer 211 not only protects the sidewalls and the top surfaces of the second portions 1032, but also supports the multiple semiconductor pillars 103 arranged in an array, which is beneficial to form a stable semiconductor structure.

In some embodiments, before forming a first sacrificial layer covering a sidewall of each of the first portions, the method further includes the following operations.

The first portions are alloyed to reduce resistance of the first portions.

Referring to the above FIGS. 17A to 17E, the first supporting layer 211 not only protects the sidewalls and the top surfaces of the second portions 1032, but also supports the plurality of semiconductor pillars 103 arranged in the array, which is beneficial to alloy the exposed sidewalls of the first portion 1031 to obtain the first portions 1031 with a smaller resistivity.

In some embodiments, the alloying of the first portions includes the following operations.

A metal layer covering a sidewall of each of the first portions is formed.

The metal layers and the first portions are allowed to react to form a metal compound by a rapid thermal process.

Referring to the above FIGS. 17A to 17E again, a method for forming the metal layers includes, but is not limited to PVD, CVD, ALD and the like.

The rapid thermal process is used to allow the metal layers and the first portions react to form the metal compound.

Herein, a material of the metal layers facilitates the formation of a compound with the material of the first portions 1031, and the compound can reduce the resistivity of the first portions 1031. Illustratively, the material for forming the metal layers includes, but is not limited to, one of cobalt (Co), nickel (Ni), zinc (Zn), silver (Ag), and titanium (Ti).

Illustratively, the material for forming the metal layers includes cobalt (Co). The material of the first portions 1031 includes silicon (Si). By performing the rapid thermal process, cobalt reacts with silicon to generate cobalt silicide. Due to the presence of cobalt silicide, a resistivity of the alloyed first portions 1031 is lower than a resistivity of the unalloyed first portions 1031, which is beneficial to reducing the resistance.

Referring to FIGS. 18A to 18E, S203 is performed, to form a first sacrificial layer 221 covering a sidewall of each of the first portions 1031.

A material of the first sacrificial layers 221 may include, but is not limited to, silicon nitride.

A process for forming the first sacrificial layers 221 may be referred to the process for forming the third sacrificial layers described above with reference to FIGS. 5A-5E and will not be described here.

It is to be noted that, when the first sacrificial layers 221 are formed by a RTS process, in an extension direction of the first portions 1031 and close to the substrate 101, the first sacrificial layers 221 can also be deposited with a greater thickness on the sidewalls of the bottoms of the first portions 1031. Therefore, an uneven thickness of the first sacrificial layers 221 in the extension direction of the first portions 1031 can be avoided.

In practical application, each of the first sacrificial layers 221 surrounds a sidewall of the first portion 1031. The multiple first sacrificial layers 221 are independent of each other.

Referring to FIGS. 19A-19E, S204 is performed to fill a second sacrificial layer 222 at least in gaps between the first sacrificial layers 221. Illustratively, the second sacrificial layer 222 is filled in the gaps between the first sacrificial layers 221 and the gaps between the first supporting layers 211.

A material of the second sacrificial layer 222 is different from the material of the first sacrificial layers 221. The material of the second sacrificial layer 222 may include, but is not limited to, polysilicon.

In practical application, the second sacrificial layer 222 may be filled by a PVD process, a CVD process, an ALD process, or the like.

Referring to FIGS. 20A to 20E, S205 is performed to remove the first supporting layer 211 (referring to FIGS. 19A to 19E) to expose the sidewalls and the top surfaces of the second portions 1032.

Referring to FIGS. 21A to 21E, S206 is performed to remove the first sacrificial layers 221 (referring to FIGS. 20A to 20E), form first filling regions A1 surrounding the first portions 1031, and expose the sidewalls of the first portions 1031.

Referring to FIGS. 22A to 22E, S207 is performed to form a first electrode layer 3151 in each of the first filling regions A1.

In practical application, each of the first filling areas A1 surrounds the sidewall of the first portion 1031. The multiple first filling areas A1 are independent of each other. Self-aligned fill spaces for filling the first electrode layers 3151 are formed between the first portions 1031 and the second sacrificial layer 222.

The first electrode layers 3151 may be filled by a PVD process, a CVD process, an ALD process, or the like.

In some specific embodiments, a material for forming the first electrode layers 3151 may include, but is not limited to, ruthenium (Ru), ruthenium oxide (RuO), titanium nitride (TiN).

Referring to FIGS. 23A to 23E, S208 is performed, to remove the second sacrificial layer 222 (referring to FIGS. 22A to 22E), and form second filling regions A2 surrounding the first electrode layers 3151.

Referring to FIGS. 24A to 24E, S209 is performed, to form dielectric layers 3152 and second electrode layers 3153 sequentially in the second filling regions A2.

In practical application, each of the second filling regions A2 surrounds a sidewall of the first electrode layer 3151.

Self-aligned fill spaces for filling the dielectric layers 3152 and the second electrode layers 3153 are formed between the first electrode layers 3151.

The dielectric layers 3152 and the second electrode layers 3153 may be filled by a PVD process, a CVD process, an ALD process, or the like.

A material for forming the dielectric layer 3152 includes a high dielectric constant (High-K) material, which generally refers to a material with a dielectric constant higher than 3.9, and generally significantly higher than this value. In some specific examples, the material of the dielectric layers may include, but is not limited to, alumina ($Al_2O_3$), zirconia (ZrO), hafnium oxide ($HfO_2$), strontium titanate ($SrTiO_3$), and the like.

In some specific embodiments, a material for forming the second electrode layers 3153 may include, but is not limited to, ruthenium, ruthenium oxide, and titanium nitride.

In the embodiments of the disclosure, under protection and support of the first supporting layer, the first sacrificial layers covering the sidewalls of the first portions are formed, and the second sacrificial layer is filled at least in gaps between the first sacrificial layers. By double sacrificial layers composed of the first sacrificial layers and the second sacrificial layer, the self-isolated first electrode layers are respectively prepared, to obtain memory structures covering sidewalls of the first portions, and each of the memory structures includes a first electrode layer, a dielectric layer and a second electrode layer. In the embodiments of the present disclosure, the multiple first electrode layers formed by using the double sacrificial layers method are independent of each other, thereby alleviating the mutual interference problem between the multiple first electrode layers. Meanwhile, the sidewalls of each of the electrode layers and the dielectric layers obtained by using the double sacrificial layers method are better in conformity, so that the performance of the semiconductor structure can be improved.

Figure 25:
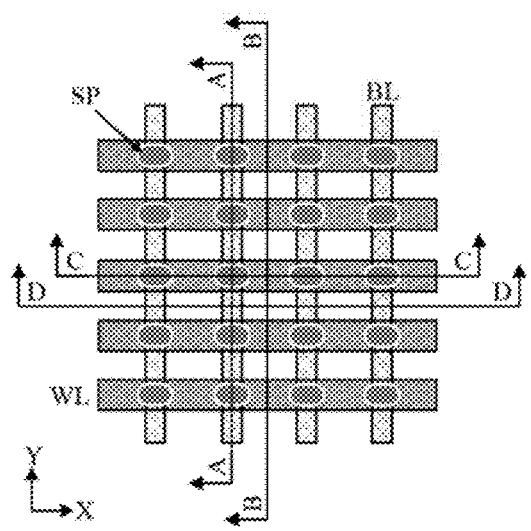
FIG. 25 is a plan-view schematic diagram of a structure of a memory provided by an embodiment of the disclosure.

FIG. 25 is a plan-view schematic diagram of a structure of a memory provided by an embodiment of the disclosure. FIG. 25 may be understood as the memory to be formed on the basis of FIG. 24E. The memory includes transistor structures, word lines and bit lines. In order to maintain consistency with the above operations, an arrangement of the semiconductor pillars (SP) in FIG. 25 may be understood with reference to the arrangement of the second portions 1032 shown in FIG. 24E. Cross-sectional directions A-A, B-B, C-C, D-D in FIG. 25 may also be understood with reference to cross-sectional positions in FIG. 24E. Cross-section A-A in FIG. 25 represents a plane along a Y-Z plane and passing through a row of the transistors arranged in the second direction. Cross-section B-B in FIG. 25 represents a plane along a Y-Z plane and not passing through a row of the transistors arranged in the second direction. Cross-section C-C in FIG. 25 represents a plane along an X-Z plane and passing through a row of the transistors arranged in the first direction. Cross-section D-D in FIG. 25 represents a plane along an X-Z plane and not passing through a row of the transistors arranged in the first direction.

It is to be noted that, FIG. 25 shows the semiconductor pillars SP, the word lines WL, and the bit lines BL included in the memory, and the semiconductor pillars SP, the word lines WL, and the bit lines BL are shown by being projected in an X-Y plane. An extension direction of the word lines WL and an extension direction of the bit lines BL are perpendicular to each other. The word lines WL extend in the first direction and are arranged in the second direction. The bit lines BL extend in the second direction and are arranged in the first direction. A channel structure (not shown) in each of the semiconductor pillars SP, a source and a drain (not shown) formed at both ends in the extension direction of the semiconductor pillar SP, and a gate structure (not shown) surrounding the sidewall of the semiconductor pillar SP constitute a transistor of the memory. It is to be understood that, the word lines WL surround the gate structures (not shown) of the sidewalls of the semiconductor pillars SP. Each of the word lines electrically connects the gates of a row of the transistors arranged in the first direction.

S210 is performed to form the multiple transistors. A channel structure of each of the transistors is located in the second portion, and an extension direction of the channel structure is the same as the extension direction of the second portion.

In some embodiments, the formation of multiple transistors includes the following operations.

A gate structure covering at least one side of each of the second portions is formed.

A source and a drain are formed respectively at two opposite ends of the second portion.

Herein, in different types of transistors, gates have different shapes. Illustratively, referring to FIG. 25, in a cylindrical gate transistor, a gate is formed in a cylindrical form on one side of the channel region. In a semi-surround gate transistor, a gate semi-surrounds the channel region. In a Gate All Around (GAA) transistor, a gate completely surrounds the channel region.

A type of the transistor in the embodiments of the present disclosure may include the above-mentioned various types, but are not limited thereto. Preferably, referring to FIG. 25, the type of the transistors is a GAA transistor.

It is to be noted that the gate structure herein includes a gate (G) and a gate oxide layer. The gate oxide layer is located between the gate and a channel region, such that the channel region and the gate are electrically isolated, and a hot carrier effect of the transistors is reduced.

A material of the gate may include a metal and/or polysilicon (Poly) or the like. A material of the gate oxide layers may include, but is not limited to silicon oxide.

In some embodiments, a method for forming the gates includes, but is not limited to, PVD, CVD, ALD or the like. The method for forming the gate oxide layer includes, but is not limited to, in-situ oxidation.

A source and a drain are formed respectively at two opposite ends of each of the second portions.

In some embodiments, a method for forming sources and drains includes, but is not limited to an ion implantation process and a diffusion process.

It is to be noted that, the source and the drain at two opposite ends of each of the second portions are interchangeable. The actual situation may be selected and set according to the actual needs.

It is to be understood that, the memory in the above embodiment is of a Transistor on Capacitor (TOC) structure, and the structure further includes multiple bit lines located above the transistors and in electrical contact with the tops of the second portions.

Therefore, in some embodiments, referring to FIG. 25, the method further includes forming bit lines (BL) above the transistors.

It is to be understood that, the bit line BL is used to perform a read or write operation on a transistor when the transistor is turned on.

Herein, the bit lines BL are arranged above the transistors, and the bit lines BL are metal bit lines (Metal BL), so that resistance can be reduced and process difficulty can be reduced. The arrangement is more compatible with a solution of circuit design of the memory.

Based on the above, the embodiments of the disclosure provide a method for manufacturing a semiconductor structure. The method includes the following operations. Multiple semiconductor pillars are formed on the substrate. Each of the semiconductor pillars includes a first portion and a second portion on the first portion. A first supporting layer covering sidewalls and top surfaces of the second portions is formed. Under protection and support of the first supporting layer, first sacrificial layers covering sidewalls of the first portions are formed, and a second sacrificial layer fills at least in gaps between the first sacrificial layers. By double sacrificial layers composed of the first sacrificial layers and the second sacrificial layer, self-isolated first electrode layers are respectively prepared, to obtain memory structures covering sidewalls of the first portions, and each of the memory structure includes a first electrode layer, a dielectric layer and a second electrode layer. Channel structures of the transistors located in the second portions are formed. In the embodiments of the present disclosure, the multiple first electrode layers formed by using the double sacrificial layers method are independent of each other, thereby alleviating the mutual interference problem between the multiple first electrode layers. Meanwhile, the sidewalls of each of the electrode layers and the dielectric layers obtained by using the double sacrificial layers method are better in conformity, so that the performance of the semiconductor structure can be improved. In addition, the formation of the memory structure and the transistor on the same active pillar can reduce the difficulty of aligning the memory cell with the transistor, thereby reducing the difficulty of the process.

According to another aspect of the present disclosure, the embodiments of the disclosure provide a semiconductor structure. The semiconductor structure includes a substrate, multiple semiconductor pillars on the substrate, memory structures, and multiple transistors.

The multiple semiconductor pillars are arrayed along a first direction and a second direction. Each of the semiconductor pillars includes a first portion and a second portion on the first portion. The first direction and the second direction intersect and are both parallel to a top surface of the substrate.

Each of the memory structures includes a first electrode layer, a dielectric layer and a second electrode layer. The first electrode layers cover sidewalls of the first portions. The first electrode layers are located in first filling regions arranged at intervals. Each of the first filling regions surrounds a sidewall of each of the first portions. The dielectric layers cover at least surfaces of the first electrode layers. The second electrode layers cover surfaces of the dielectric layers.

A channel structure of each of the transistors is located in the second portion, and the channel structures extend in a same direction as the second portions.

In some embodiments, a cross-sectional shape of each of the channel structures includes an ellipse or a strip.

In some embodiments, a material of the second portions is different from a material of the first portions.

In some embodiments, the material of first portions includes a metal compound and the material of second portions includes a semiconductor material.

In some embodiments, the substrate includes an isolation structure on which the multiple active pillars are located.

In some embodiments, each of the transistors includes a gate structure covering at least one side of the corresponding second portion, and a source and a drain respectively arranged at two opposite ends of the second portion.

In some embodiments, the semiconductor structure further includes multiple bit lines. The multiple bit lines are located above the transistors and electrically connected with tops of the second portions.

FIG. 25 is a plan-view schematic diagram of a structure of a memory provided by an embodiment of the disclosure. In order to maintain consistency with the above operations, an arrangement of the semiconductor pillars (SP) in FIG. 25 may be understood with reference to the arrangement of the second portions 1032 in FIG. 24E. Cross-sectional directions A-A, B-B, C-C, D-D in FIG. 25 may also be understood with reference to cross-sectional positions in FIG. 24E. Cross-section A-A in FIG. 25 represents a plane along a Y-Z plane and passing through a row of the transistors arranged in the second direction. Cross-section B-B in FIG. 25 represents a plane along a Y-Z plane and not passing through a row of the transistors arranged in the second direction. Cross-section C-C in FIG. 25 represents a plane along an X-Z plane and passing through a row of the transistors arranged in the first direction. Cross-section D-D in FIG. 25 represents a plane along an X-Z plane and not passing through a row of the transistors arranged in the first direction.

It is to be noted that, FIG. 25 shows the semiconductor pillars SP, the word lines WL, and the bit lines BL comprised in the memory, and the semiconductor pillars SP, the word lines WL, and the bit lines BL are shown by being projected in an X-Y plane. An extension direction of the word lines WL and an extension direction of the bit lines BL are perpendicular to each other. The word lines WL extend in the first direction and are arranged in the second direction. The bit lines BL extend in the second direction and are arranged in the first direction. A channel structure (not shown) in each of the semiconductor pillars SP, a source and a drain (not shown) formed at both ends in the extension direction of the semiconductor pillar SP, and a gate structure (not shown) surrounding the sidewall of the semiconductor pillar SP constitute a transistor of the memory. It is to be understood that, the word lines WL surround the gate structures (not shown) on the sidewalls of the semiconductor pillars SP. Each of the word lines electrically connects the gates in a row of the transistors arranged in the first direction.

The semiconductor structure provided by the embodiments of the disclosure is similar to the semiconductor structure formed by the method for manufacturing the semiconductor structure in the above-mentioned embodiments. Technical features which are not described in detail in the embodiments of the disclosure may be understood by referring to the above-mentioned embodiments, and will not be repeated here.

According to yet another aspect of the present disclosure, a memory is provided. The memory includes one or more semiconductor structures according to any one of the above embodiments.

Based on the above, in the embodiments of the present disclosure, by providing a corresponding isolation structure between each active pillar and the substrate, a memory structure (e.g. a capacitor) formed on part of a sidewall of the active pillar can be isolated, thereby reducing a leakage problem of the memory structure (e.g. a capacitor) in use.

The features disclosed in the several embodiments of methods or devices provided by the disclosure can be arbitrarily combined without conflict, in order to obtain a new embodiment of a method or of a device.

The above-mentioned is only specific embodiments of the disclosure, but the scope of protection of the disclosure is not limited thereto. Any skilled person familiar with the technical field can easily think of variants or replacements within the technical scope of the disclosure, which should be covered within the scope of protection of the disclosure. Therefore, the scope of protection of the disclosure should be subject to the scope of protection of the claims.

INDUSTRIAL APPLICABILITY

In the embodiments of the present disclosure, the multiple first electrode layers formed by using the double sacrificial layers method are independent of each other, thereby alleviating the mutual interference problem between the multiple first electrode layers. Meanwhile, the sidewalls of each of the electrode layers and the dielectric layers obtained by using the double sacrificial layers method are better in conformity, so that the performance of the semiconductor structure can be improved. In addition, the formation of the memory structure and the transistor on the same active pillar can reduce the difficulty of aligning the memory cell with the transistor, thereby reducing the difficulty of the process.

What is claimed is:

1. A method for manufacturing a semiconductor structure, comprising:
   providing a substrate, and forming a plurality of semiconductor pillars arrayed along a first direction and a second direction on the substrate, wherein each of the semiconductor pillars comprises a first portion and a second portion on the first portion, the first direction and the second direction intersect and are both parallel to a top surface of the substrate;
   forming a first supporting layer covering sidewalls and top surfaces of the second portions;
   forming a first sacrificial layer covering a sidewall of each of the first portions;
   filling a second sacrificial layer at least in gaps between the first sacrificial layers;
   removing the first supporting layer to expose the sidewalls and the top surfaces of the second portions;
   removing the first sacrificial layers, to form first filling regions surrounding the first portions, and to expose the sidewalls of the first portions:
   forming a first electrode layer in each of the first filling regions;
   removing the second sacrificial layer to form second filling regions surrounding the first electrode layers;
   forming dielectric layers and second electrode layers sequentially in the second filling regions; and
   forming a plurality of transistors, wherein channel structures of the transistors are located in the second portions, and the channel structures extend in a same direction as the second portions.

2. The method for manufacturing a semiconductor structure of claim 1, wherein the forming a plurality of semiconductor pillars arrayed along a first direction and a second direction on the substrate, comprises:
   providing a semiconductor substrate; and
   forming a plurality of first trenches arranged at intervals along a first direction and a plurality of second trenches arranged at intervals along a second direction in the semiconductor substrate, wherein the first trenches divide the semiconductor substrate into a plurality of semiconductor strips, and the second trenches divide each of the semiconductor strips into a plurality of semiconductor pillars, a width of each of the semiconductor pillars in the first direction is different from a width of the semiconductor pillar in the second direction.

3. The method for manufacturing a semiconductor structure of claim 2, further comprising:
   forming third sacrificial layers at sidewalls of the first trenches prior to forming the second trenches;
   enlarging a bottom of each of the first trenches;
   removing the third sacrificial layers;
   performing an oxidation treatment on the semiconductor strips, to completely oxidize a portion of each of the semiconductor strips, which corresponds to the enlarged portion of the first trench, into an oxide strip, and to oxidize surfaces of a remaining portion of the semiconductor strip into oxide layers; and
   filling a first insulating material in gaps between the oxide layers and between the oxide strips.

4. The method for manufacturing a semiconductor structure of claim 3, further comprising:
   filling a first insulating material in the first trenches in which the third sacrificial layers are formed, after forming the third sacrificial layers on the sidewalls of the first trenches; and
   forming a plurality of second supporting layers arranged at intervals in the second direction on the semiconductor strips and the first insulating material, removing the first insulating material filled in the first trenches, and enlarging the bottoms of the first trenches.

5. The method for manufacturing a semiconductor structure of claim 4, wherein the forming the second trenches comprises:
   etching the semiconductor substrate to form the second trenches by using the second supporting layers as a mask.

6. The method for manufacturing a semiconductor structure of claim 1, wherein the forming a first supporting layer covering sidewalls and top surfaces of the second portions comprises:
   filling a first insulating material between the plurality of semiconductor pillars;
   removing part of the first insulating material in the first direction to form a plurality of first shallow trenches, wherein bottom surfaces of the first shallow trenches are flush with bottom surfaces of the second portions;
   depositing a first supporting material on top surfaces of the semiconductor pillars and in the first shallow trenches;
   removing part of the first insulating material in the second direction to form a plurality of second shallow trenches, wherein bottom surfaces of the second shallow trenches are flush with the bottom surfaces of the second portions; and
   filling the first supporting material in the second shallow trenches to form the first supporting layer.

7. The method for manufacturing a semiconductor structure of claim 1, further comprising:
   alloying the first portions to reduce resistance of the first portions prior to forming a first sacrificial layer covering a sidewall of each of the first portions.

8. The method for manufacturing a semiconductor structure of claim 7, wherein the alloying the first portions comprises:
   forming a metal layer covering a sidewall of each of the first portions; and
   allowing the metal layers and the first portions to react and form a metal compound by a rapid thermal process.

9. The method for manufacturing a semiconductor structure of claim 1, wherein the forming a plurality of transistors comprises:
- forming a gate structure covering at least one side of the second portion; and
- forming a source and a drain respectively at two opposite ends of the second portion.

\* \* \* \* \*